United States Patent
Yang

(10) Patent No.: US 12,439,756 B2
(45) Date of Patent: Oct. 7, 2025

(54) LIGHT EMITTING DEVICE PACKAGE AND DISPLAY DEVICE HAVING THE SAME

(71) Applicant: SEOUL VIOSYS CO., LTD., Gyeonggi-do (KR)

(72) Inventor: Myoung Hak Yang, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/519,229

(22) Filed: Nov. 27, 2023

(65) Prior Publication Data

US 2024/0097094 A1    Mar. 21, 2024

Related U.S. Application Data

(63) Continuation of application No. 17/502,040, filed on Oct. 15, 2021, now Pat. No. 11,830,968, which is a
(Continued)

(51) Int. Cl.
| | |
|---|---|
| *H10H 20/857* | (2025.01) |
| *H01L 25/075* | (2006.01) |
| *H10D 86/40* | (2025.01) |
| *H10D 86/60* | (2025.01) |
| *H10H 20/813* | (2025.01) |

(Continued)

(52) U.S. Cl.
CPC ....... *H10H 20/857* (2025.01); *H01L 25/0753* (2013.01); *H10D 86/40* (2025.01); *H10D 86/60* (2025.01); *H10H 20/813* (2025.01); *H10H 20/8314* (2025.01); *H10H 20/8316* (2025.01); *H10H 20/84* (2025.01); *H10H 20/032* (2025.01); *H10H 20/0363* (2025.01)

(58) Field of Classification Search
None
See application file for complete search history.

(56) References Cited

U.S. PATENT DOCUMENTS

| | | | | |
|---|---|---|---|---|
| 3,964,157 A | * | 6/1976 | Kuhn | ........ H01L 24/80 257/E33.059 |
| 5,369,302 A | * | 11/1994 | Chen | ......... H01L 21/76877 257/E21.585 |

(Continued)

FOREIGN PATENT DOCUMENTS

| | | |
|---|---|---|
| JP | 2005047035 A | 2/2005 |
| JP | 2005153335 A | 6/2005 |

(Continued)

OTHER PUBLICATIONS

Japanese Patent Application No. 2021-540466, Office Action dated Jan. 23, 2024, 4 pgs.

(Continued)

*Primary Examiner* — Feifei Yeung Lopez
(74) *Attorney, Agent, or Firm* — LaBatt, LLC

(57) ABSTRACT

A display device including a base substrate having a front surface and a rear surface, and including a first recess portion recessed from the front surface, a plurality of outer electrodes disposed on the base substrate, a light emitting device disposed in the first recess portion and configured to emit light in a direction away from the base substrate, the light emitting device including a light emitting structure electrically connected to the outer electrodes.

20 Claims, 24 Drawing Sheets

Related U.S. Application Data continuation of application No. 16/737,984, filed on Jan. 9, 2020, now Pat. No. 11,152,553.

(60) Provisional application No. 62/792,680, filed on Jan. 15, 2019.

(51) Int. Cl.
    *H10H 20/831*     (2025.01)
    *H10H 20/84*     (2025.01)
    *H10H 20/01*     (2025.01)

(56) References Cited

U.S. PATENT DOCUMENTS

| | | | |
|---|---|---|---|
| 8,026,533 | B2 | 9/2011 | Takuya |
| 9,658,486 | B2 | 5/2017 | Min |
| 10,453,827 | B1 * | 10/2019 | Hussell ............... H01L 33/58 |
| 11,152,553 | B2 | 10/2021 | Yang |
| 11,166,369 | B2 | 11/2021 | Eymard et al. |
| 11,830,968 | B2 | 11/2023 | Yang |
| 2003/0141813 | A1 * | 7/2003 | Miyashita ............ H01L 33/486 |
| | | | 257/E25.02 |
| 2006/0231852 | A1 * | 10/2006 | Kususe ................. H01L 33/62 |
| | | | 257/79 |
| 2009/0278139 | A1 * | 11/2009 | Fjelstad ............ H01L 25/0753 |
| | | | 257/E33.001 |
| 2010/0096659 | A1 | 4/2010 | Noma |
| 2011/0204376 | A1 * | 8/2011 | Su ..................... H01L 25/0756 |
| | | | 438/46 |
| 2011/0309378 | A1 * | 12/2011 | Lau ................... H10H 29/142 |
| | | | 438/26 |
| 2012/0140520 | A1 * | 6/2012 | Jung .................. G02B 6/0031 |
| | | | 362/609 |
| 2012/0261689 | A1 * | 10/2012 | Appelt ................ H01L 21/4832 |
| | | | 257/E33.059 |
| 2012/0275181 | A1 | 11/2012 | Min |
| 2013/0285084 | A1 | 10/2013 | Schneider et al. |
| 2014/0065740 | A1 | 3/2014 | Huang et al. |
| 2015/0214430 | A1 * | 7/2015 | Zhan ................. H01L 25/0753 |
| | | | 438/28 |
| 2016/0020353 | A1 * | 1/2016 | Chu ....................... H01L 24/97 |
| | | | 257/21 |
| 2017/0062397 | A1 | 3/2017 | Park |
| 2017/0063047 | A1 | 3/2017 | Steigerwald et al. |
| 2017/0133550 | A1 * | 5/2017 | Schuele ............... H10H 20/824 |
| 2018/0219133 | A1 | 8/2018 | Park et al. |

FOREIGN PATENT DOCUMENTS

| | | |
|---|---|---|
| JP | 2009044116 | 2/2009 |
| JP | 2013077144 A | 4/2013 |
| JP | 2013115070 A | 6/2013 |
| JP | 2015018873 A | 1/2015 |
| JP | 2017183458 | 10/2017 |
| KR | 101852388 | 4/2018 |
| KR | 1020180040073 | 4/2018 |
| WO | 2013077144 | 5/2013 |
| WO | 2018020185 | 2/2018 |

OTHER PUBLICATIONS

U.S. Appl. No. 17/502,040, Office Action dated Nov. 30, 2022, 14 pages.
U.S. Appl. No. 17/502,040, Final Office Action dated Mar. 15, 2023, 15 pages.
U.S. Appl. No. 17/502,040, Notice of Allowance dated Aug. 4, 2023, 8 pages.
U.S. Appl. No. 16/737,984, Notice of Allowance dated Jun. 10, 2021, 8 pages.
Search Report dated Sep. 23, 2022, issued to EP Patent Application No. 20741657.9.

* cited by examiner

LIGHT EMITTING DEVICE PACKAGE AND DISPLAY DEVICE HAVING THE SAME

CROSS-REFERENCE TO RELATED APPLICATIONS

This application is a continuation of U.S. patent application Ser. No. 17/502,040, filed on Oct. 15, 2021, which is a continuation of U.S. patent application Ser. No. 16/737,984, filed on Jan. 9, 2020, which claims priority from and the benefit of U.S. Provisional Application No. 62/792,680, filed on Jan. 15, 2019, each of which is hereby incorporated by reference for all purposes as if fully set forth herein.

BACKGROUND

Field

Exemplary embodiments of the invention relate generally to a light emitting device package implementing colors and a display device having the same.

Discussion of the Background

In recent years, display devices employing light emitting diodes (LED) have been developed. The display device employing the light emitting diode may be manufactured by forming structures of red, green, and blue light emitting diodes, which are individually grown, on a final substrate.

However, in addition to the needs for a high-resolution and full-color display device, the needs for a display device having a high level of color purity and color reproducibility that may be manufactured by a simplified process are also steadily increasing.

The above information disclosed in this Background section is only for understanding of the background of the inventive concepts, and, therefore, it may contain information that does not constitute prior art.

SUMMARY

Light emitting device packages and display device having the same constructed according to exemplary embodiments of the invention have a simple structure that facilitates manufacturing through a simple process.

Additional features of the inventive concepts will be set forth in the description which follows, and in part will be apparent from the description, or may be learned by practice of the inventive concepts.

A light emitting device package according to an exemplary embodiment includes a base substrate having a front surface and a rear surface, and including a first recess portion recessed from the front surface, a plurality of outer electrodes disposed on the front surface, a light emitting device disposed in the first recess portion and configured to emit light in a direction away from the base substrate, the light emitting device including a substrate, a light emitting structure disposed on the substrate, and a plurality of bump electrodes disposed on the substrate, and a plurality of connection electrodes connecting the light emitting device to the outer electrodes, in which an upper surface of the bump electrodes and an upper surface of the outer electrodes are disposed on substantially the same plane, and each of the connection electrodes is disposed on one of the bump electrodes and one of the outer electrodes that are adjacent to each other.

The light emitting device package may further include a first insulating member disposed on the base substrate, in which the first insulating member may include second recess portions exposing a portion of the outer electrodes.

The light emitting device package may further include a second insulating member disposed on the light emitting structure, in which the second insulating member may include third recess portions exposing a portion of the bump electrodes.

The second insulating member may include an opening exposing a portion of an upper surface of the light emitting structure.

The opening may have at least one of a polygonal shape, a closed shape with at least one straight line and at least one curved line, and a closed shape with a curved line.

Each of the connection electrodes may be disposed in one of the second recess portions and one of the third recess portions adjacent to each other.

The base substrate and the first and second insulating members may include a light shielding material.

The first recess portion may be defined by a bottom surface and a sidewall, and the sidewall may be inclined with respect to the bottom surface.

The second recess portion may be defined by a sidewall of the first insulating member and the upper surface of the exposed outer electrodes, and the sidewall may be inclined with respect to the upper surface of the outer electrodes.

The light emitting device package may further include a cover member disposed in the first, second, and third recess portions.

At least one of the bump electrodes may be disposed on the substrate.

The first recess portion may have a depth that is substantially equal to a thickness of the substrate.

At least one of the bump electrodes may be disposed on the light emitting structure.

The first recess portion may have a depth that is greater than a thickness of the substrate.

The light emitting structure may include a plurality of epitaxial stacks sequentially stacked on the substrate and configured to emit light having different wavelength bands from each other, and the light emitting structure may have a light emission area in an area overlapped by the plurality of epitaxial stacks.

The epitaxial stacks may include a first epitaxial stack configured to emit a first light, a second epitaxial stack disposed on the first epitaxial stack and configured to emit a second light having a wavelength band different from that of the first light, and a third epitaxial stack disposed on the second epitaxial stack and configured to emit a third light having a wavelength band different from those of the first and second lights.

Each of the first, second, and third epitaxial stacks may include a p-type semiconductor layer, an active layer disposed on the p-type semiconductor layer, and an n-type semiconductor layer disposed on the active layer.

The bump electrodes may include a first bump electrode connected to the n-type semiconductor layer of the first epitaxial stack, a second bump electrode connected to the n-type semiconductor layer of the second epitaxial stack, a third bump electrode connected to the n-type semiconductor layer of the third epitaxial stack, and a fourth bump electrode connected to the p-type semiconductor layers of the first, second, and third epitaxial stacks.

The outer electrodes may include first, second, third, and fourth outer electrodes respectively connected to the first, second, third, and fourth bump electrodes.

The connection electrodes may include first, second, third, and fourth connection electrodes that respectively connect the first, second, third, and fourth outer electrodes to the first, second, third, and fourth bump electrodes.

Each of the first, second, third, and fourth connection electrodes may be disposed over an edge of the light emitting structure and a portion of a front surface of the base substrate.

A display device according to another exemplary embodiment includes a plurality of pixels, each pixel including a base substrate having a front surface and a rear surface, and including a first recess portion recessed from the front surface, a plurality of outer electrodes disposed on the front surface, a light emitting device disposed in the first recess portion and configured to emit light in a direction away from the base substrate, the light emitting device including a substrate, a light emitting structure disposed on the substrate, and a plurality of bump electrodes disposed on the substrate, and a plurality of connection electrodes connecting the light emitting device to the outer electrodes, in which an upper surface of the bump electrodes and an upper surface of the outer electrodes are disposed on substantially the same plane, and each of the connection electrodes is disposed on one of the bump electrodes and one of the outer electrodes that are adjacent to each other It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
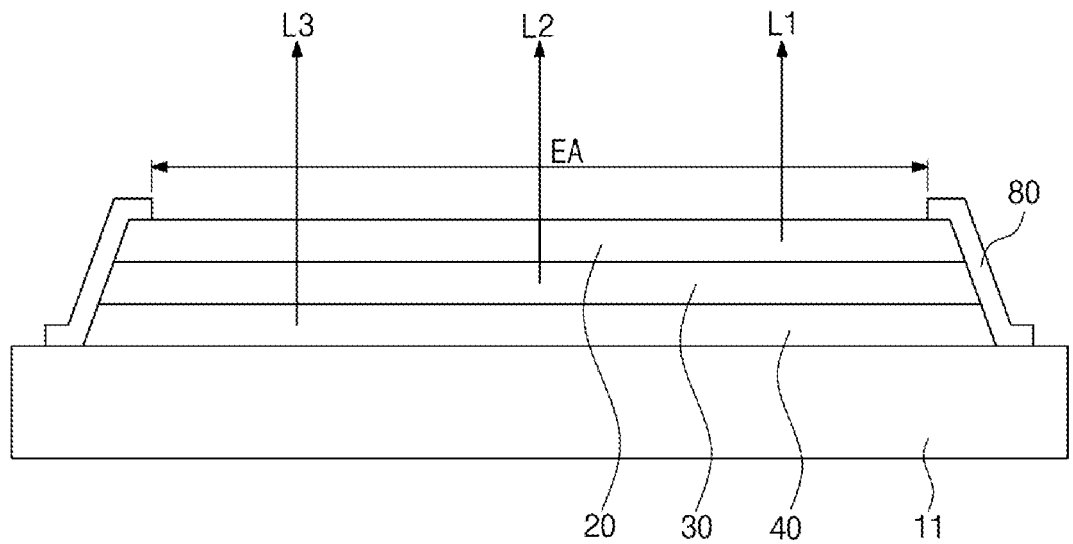
FIG. 1 is a schematic cross-sectional view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments of the invention relate to a light emitting device that is capable of emitting light. The light emitting device constructed according to the principles of the invention may be employed in a variety of devices as a light source.

FIG. 1 is a cross-sectional view of a light emitting device according to an exemplary embodiment.

Referring to FIG. 1, the light emitting device according to an exemplary embodiment includes a light emitting structure including a plurality of epitaxial stacks sequentially stacked one over another. The epitaxial stacks are disposed on a substrate 11.

The substrate 11 has substantially a plate shape provided with a front surface and a rear surface.

According to an exemplary embodiment, the epitaxial stacks include at least two or more epitaxial stacks, and at least one of the epitaxial stacks may emit light having different wavelength bands from another epitaxial stack. More particularly is, the epitaxial stacks may have the same energy bands as each other or have different energy bands from each other. In the illustrated exemplary embodiment, three epitaxial stacks are sequentially stacked on the substrate 11. The epitaxial stacks are stacked on the front surface of the substrate 11 in the order of a third epitaxial stack 40, a second epitaxial stack 30, and a first epitaxial stack 20.

The substrate 11 may be formed of a light transmitting insulating material. As used herein, the substrate 11 having "the light transmitting property" may refer to that the substrate 11 is transparent to transmit the entire light, the substrate 11 is semi-transparent to transmit only a portion of light, or the substrate 11 is partially transparent to transmit only a portion of the light.

The substrate 11 may be a growth substrate capable of growing an epitaxial stack provided directly on the substrate 11, such as the third epitaxial stack 40. For example, the substrate 11 may be a sapphire substrate. However, the inventive concepts are not limited thereto, and the substrate 11 may include various transparent insulating materials other than the sapphire substrate, as long as the substrate 11 may be provided with the epitaxial stack on its upper surface and has light transmitting and insulating properties. For example, the substrate 11 may include glass, quartz, silicon, an organic polymer, or an organic-inorganic composite material. According to an exemplary embodiment, a line part may be further disposed on the substrate 11 to apply a light emitting signal and a common voltage to each of the epitaxial stacks. In this case, the substrate 11 may be provided as a printed circuit board or a composite substrate, which may be obtained by forming the line part and/or a driving device on the glass, silicon, quartz, organic polymer, or organic-inorganic composite material.

Each epitaxial stack may emit light towards a direction, in which the front surface of the substrate 11 faces. In this case, light emitted from one epitaxial stack may pass through another epitaxial stack disposed on an optical path of light emitted from the one epitaxial stack.

In the illustrated exemplary embodiment, the first epitaxial stack 20 emits a first light L1, the second epitaxial stack 30 emits a second light L2, and the third epitaxial stack 40 emits a third light L3. The first, second, and third lights L1, L2, and L3 may be the same as or different from each other. According to an exemplary embodiment, the first, second, and third lights L1, L2, and L3 may be color lights in a visible light wavelength band.

According to an exemplary embodiment, the first, second, and third lights L1, L2, and L3 may have different wavelength bands from each other, which are sequentially lengthened. In particular, the first, second, and third lights L1, L2, and L3 may have different wavelength bands from each other, and may be lights of a short wavelength band having an energy that gradually decreases from the first light L1 to the third light L3. In the illustrated exemplary embodiment, the first light L1 may be a blue light, the second light L2 may be a green light, and the third light L3 may be a red light.

However, the inventive concepts are not limited thereto. For example, in some exemplary embodiments, the first, second, and third lights L1, L2, and L3 may be lights having different wavelength bands from each other, which are sequentially shortened. For example, the first light L1 may be the red light, the second light L2 may be the green light, and the third light L3 may be the blue light. In addition, the first, second, and third lights L1, L2, and L3 may be lights having different wavelength bands and being randomly arranged. For example, the first light L1 may be a green light, the second light L2 may be a blue light, and the third light L3 may be a red light. In some exemplary embodiments, each of the first, second, and third lights L1, L2, and L3 may not have different wavelength bands from each other, and at least two lights among the first, second, and third lights L1, L2, and L3 may have the same wavelength band.

An insulating layer 80 is disposed on side surfaces of the epitaxial stacks, such as on the side surfaces of the first, second, and third epitaxial stacks 20, 30, and 40. The insulating layer 80 may cover only the side surfaces of the epitaxial stacks, or may additionally cover a portion of an upper surface of the uppermost epitaxial stack. The insulating layer 80 may have an opening exposing at least a portion of the upper surface of the uppermost epitaxial stack.

The insulating layer 80 may include a non-light transmissive material, and in this case, light emitted from each epitaxial stack and traveling in a lateral direction may be reflected or absorbed by the insulating layer 80. However, in some exemplary embodiments, the insulating layer 80 may include a light transmissive material. In this case, the upper surface of the uppermost epitaxial stack may not be exposed by the insulating layer 80.

According to an exemplary embodiment, the side surface of each of the epitaxial stacks may be inclined with respect to one surface of the substrate 11. For example, an angle between the side surfaces of the first, second, and third epitaxial stacks 20, 30, and 40 and the one surface of the substrate 11 may be greater than about 0 degrees and less than about 90 degrees. When the side surfaces of the first, second, and third epitaxial stacks 20, 30, and 40 have a predetermined inclination, the insulating layer 80 may be easily formed. In addition, in some exemplary embodiments, each epitaxial stack may have a tapered structure at a predetermined angle, so that a light reflection effect by the insulating layer 80 may be increased.

The epitaxial stacks according to an exemplary embodiment may be independently driven, as signal lines that respectively apply light emitting signals to the epitaxial stacks are independently connected to the epitaxial stacks. In this manner, various colors may be implemented depending on the number of epitaxial stacks emitting light. In addition, since the epitaxial stacks that emit light having different wavelengths are formed to be overlapped with each other, the light emitting structure may be formed in a narrow area.

Figure 2:
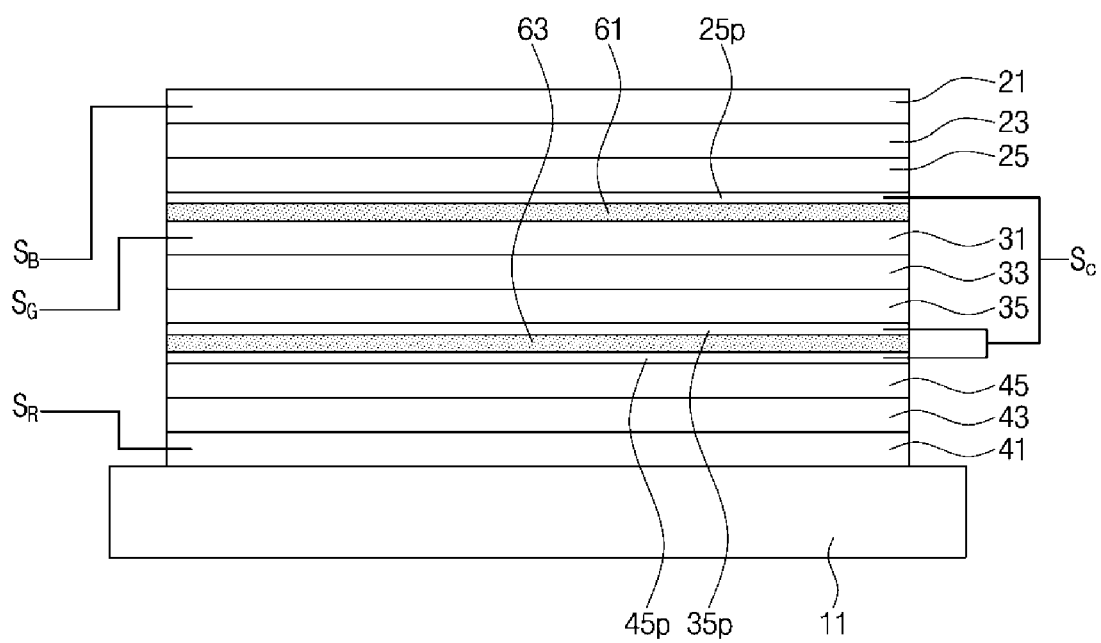
FIG. 2 is a schematic cross-sectional a light emitting device according to an exemplary embodiment.

FIG. 2 is a cross-sectional view of a light emitting stacked structure according to an exemplary embodiment. For the convenience of explanation, the insulating layer is omitted in FIG. 2.

Referring to FIG. 2, in the light emitting stacked structure according to the illustrated exemplary embodiment, the third epitaxial stack 40 is disposed on the substrate 11, the second epitaxial stack 30 is disposed on the third epitaxial stack 40 with a second adhesive layer 63 interposed therebetween, and the first epitaxial stack 20 is disposed on the second epitaxial stack 30 with a first adhesive layer 61 interposed therebetween.

The first and second adhesive layers 61 and 63 may include a non-conductive material, and may include a material having light transmitting property. For example, the first and second adhesive layers 61 and 63 may be an optically clear adhesive (OCA). The material for the first and second adhesive layers 61 and 63 is not particularly limited as long as the first and second adhesive layers 61 and 63 are optically clear and capable of stably attaching each epitaxial stack.

The third epitaxial stack 40 includes an n-type semiconductor layer 41, an active layer 43, and a p-type semiconductor layer 45, which are sequentially stacked in the upward direction. A third p-type contact electrode 45p is disposed on the p-type semiconductor layer 45 of the third epitaxial stack 40.

The n-type semiconductor layer 41, the active layer 43, and the p-type semiconductor layer may include a semiconductor material that emits red light. As the semiconductor material that emits red light, aluminum gallium arsenide (AlGaAs), gallium arsenide phosphide (GaAsP), aluminum gallium indium phosphide (AlGaInP), and gallium phosphide (GaP) may be used, without being limited thereto.

A first p-type contact electrode 45p is disposed under the p-type semiconductor layer 45 of the first epitaxial stack 40.

A first n-type contact electrode may be disposed on the n-type semiconductor layer 41 of the first epitaxial stack 40. According to an exemplary embodiment, the first n-type contact electrode may include an Au—Te alloy or an Au—Ge alloy, however, the inventive concepts are not limited thereto. More particularly, the first n-type contact electrode may have a single-layer structure or a multi-layer structure formed of a metal material. For example, the first n-type contact electrode may include metal, such as Al, Ti, Cr, Ni, Au, Ag, Sn, W, Cu, or an alloy thereof.

The second epitaxial stack 30 includes a p-type semiconductor layer 35, an active layer 33, and an n-type semiconductor layer 31, which are sequentially stacked in the upward direction. A second p-type contact electrode 35p is disposed under the p-type semiconductor layer 35 of the second epitaxial stack 30.

The p-type semiconductor layer 35, the active layer 33, and the n-type semiconductor layer 31 may include a semiconductor material that emits green light. As the semiconductor material that emits green light, indium gallium nitride (InGaN), gallium nitride (GaN), gallium phosphide (GaP), aluminum gallium indium phosphide (AlGaInP), and aluminum gallium phosphide (AlGaP) may be used, without being limited thereto.

The first epitaxial stack 20 includes a p-type semiconductor layer 25, an active layer 23, and an n-type semiconductor layer 21, which are sequentially stacked in the upward direction. The p-type semiconductor layer 25, the active layer 23, and the n-type semiconductor layer 21 of the first epitaxial stack 20 may include a semiconductor material that emits blue light. As the semiconductor material that emits blue light, gallium nitride (GaN), indium gallium nitride (InGaN), and zinc selenide (ZnSe) may be used, without being limited thereto.

According to an exemplary embodiment, each of the n-type semiconductor layers 21, 31, and 41 and each of the p-type semiconductor layers 25, 35, and 45 of the first, second, and third epitaxial stacks 20, 30, and 40 have the single-layer structure, however, in some exemplary embodiments, these layers may have a multi-layer structure and may include a superlattice layer. The active layers 23, 33, and 43 of the first, second, and third epitaxial stacks 20, 30, and 40 may have a single quantum well structure or a multiple quantum well structure.

According to an exemplary embodiment, the first, second, and third p-type contact electrodes 25p, 35p, and 45p may include a transparent conductive material to transmit light. For example, each of the first, second, and third p-type contact electrodes 25p, 35p, and 45p may include the transparent conductive oxide (TCO), such as tin oxide (SnO), indium oxide ($InO_2$), zinc oxide (ZnO), indium tin oxide (ITO), and indium tin zinc oxide (ITZO).

According to the illustrated exemplary embodiment, the first, second, and third p-type contact electrodes 25p, 35p, and 45p may be connected to a common line. The common line is a line, to which the common voltage is applied. In addition, light emitting signal lines may be respectively connected to the n-type semiconductor layers 21, 31, and 41 of the first, second, and third epitaxial stacks 20, 30, and 40. In this case, the light emitting signal line is connected to the n-type semiconductor layer 21 of the first epitaxial stack 20 via the first n-type contact electrode. According to an exemplary embodiment, a common voltage Sc is applied to the first, second, and third p-type contact electrodes 25p, 35p, and 45p via the common line, and the light emitting signal is applied to the n-type semiconductor layers 21, 31, and 41 of the first, second, and third epitaxial stacks 20, 30, and 40 via the light emitting signal lines. In this manner, the light emission of the first, second, and third epitaxial stacks 20, 30, and 40 may be individually controlled. In this case, the light emitting signal includes first, second, and third light emitting signals $S_B$, $S_G$, and $S_R$ respectively corresponding to the first, second, and third epitaxial stacks 20, 30, and 40. In the illustrated exemplary embodiment, the first, second, and third light emitting signals $S_B$, $S_G$, and $S_R$ are signals respectively corresponding to the light emissions of the blue light, the green light, and the red light.

According to an exemplary embodiment, the first, second, and third epitaxial stacks 20, 30, and 40 are driven in response to the light emitting signal applied thereto. In particular, the first epitaxial stack 20 is driven in response to the first light emitting signal $S_B$, the second epitaxial stack 30 is driven in response to the second light emitting signal $S_G$, and the third epitaxial stack 40 is driven in response to the third light emitting signal $S_R$. In this case, the first, second, and third light emitting signals $S_R$, $S_G$, and $S_B$ are independently applied to the first, second, and third epitaxial stacks 20, 30, and 40, and as such, the first, second, and third epitaxial stacks 20, 30, and 40 may be independently driven. The light emitting stacked structure may provide light of various colors with various intensities by a combination of the first, second, and third lights emitted from the first, second, and third epitaxial stacks 20, 30, and 40 to the upward direction.

In the illustrated exemplary embodiment, the common voltage is described as being applied to the p-type semiconductor layers 25, 35, and 45 of the first, second, and third epitaxial stacks 20, 30, and 40, and the light emitting signal is described as being applied to the n-type semiconductor layers 21, 31, and 41 of the first, second, and third epitaxial stacks 20, 30, and 40, however, the inventive concepts are not limited thereto. For example, according to another exemplary embodiment, the common voltage may be applied to the n-type semiconductor layers 21, 31, and 41 of the first, second, and third epitaxial stacks 20, 30, and 40, and the light emitting signal may be applied to the p-type semiconductor layers 25, 35, and 45 of the first, second, and third epitaxial stacks 20, 30, and 40.

When displaying the colors, the light emitting stacked structure having the above-described structure may provide light having different colors through an overlapping area between vertically stacked epitaxial stacks, rather than from areas that are spaced apart from each other on a plane. As such, the light emitting device according to an exemplary embodiment may be downsized and integrated. In general, light emitting devices that emit different color lights, e.g., red, green, and blue lights, are disposed to be spaced apart from each other on a plane to implement a full color display. In this case, an area occupied by the conventional light emitting devices is relatively large since light emitting devices are disposed to be spaced apart from each other on the plane. According to an exemplary embodiments, however, portions of the light emitting devices that emit different lights are disposed in the same area while being overlapped with each other to form the light emitting stacked structure, and thus, the full color display may be implemented through an area that is significantly smaller than that of the conventional light emitting devices. As such, a high-resolution display device may be manufactured in a small area.

In addition, when a plurality of epitaxial stacks that emit lights having the same wavelength band are stacked one over another, instead of the epitaxial stacks that emit lights having different wavelength bands from each other, an intensity of light emitted from a light emitting apparatus including the light emitting stacked structure described above may be controlled in various ways.

Further, even when a conventional light emitting apparatus were manufactured to have a stacked structure, the conventional light emitting apparatus may be manufactured by individually forming a contact part in each light emitting device, e.g., by forming light emitting elements individually and separately and connecting the light emitting elements to each other using a wiring. In this case, the structure of the light emitting apparatus may become complex, which may increase manufacturing complexity of the light emitting apparatus. However, the light emitting stacked structure according to an exemplary embodiment may be manufactured by sequentially stacking a plurality of epitaxial stacks on one substrate 11, forming the contact part in the epitaxial stacks through a minimal process, and connecting the line part to the epitaxial stacks. In addition, since one light emitting stacked structure is mounted, instead of multiple light emitting devices, the manufacturing method of the display device according to an exemplary embodiment may be significantly simplified, as compared with the conventional display device manufacturing method that separately manufactures the light emitting devices of individual colors and mounting the light emitting devices individually.

The light emitting device according to an exemplary embodiment may further include various components to provide light with high purity and high efficiency. For example, the light emitting device according to an exemplary embodiment may include a wavelength pass filter to prevent light having a relatively short wavelength from traveling to the epitaxial stack that emits the light having a relatively long wavelength.

The light emitting device according to an exemplary embodiment may further include various components to provide high efficiency uniform light. For example, in some exemplary embodiments, the light emitting device may include various concave-convex portions on a light emitting surface. For example, the light emitting device may include concave-convex portions formed on the n-type semiconductor layer of at least one of the first, second, and third epitaxial stacks 20, 30, and 40.

In particular, according to an exemplary embodiment, a concave-convex portion may be selectively formed on at least one of the epitaxial stacks. For example, the concave-convex portion may be disposed on the first epitaxial stack 20, the concave-convex portion may be disposed on the first and third epitaxial stacks 20 and 40, or the concave-convex portion may be disposed on the first, second, and third epitaxial stacks 20, 30, and 40. The concave-convex portion of each epitaxial stack may be disposed on the n-type semiconductor layers respectively corresponding to the light emitting surfaces of the first, second, and third epitaxial stacks 20, 30, and 40.

The concave-convex portion may improve a light emitting efficiency. The concavo-convex portion may be provided in various shapes, such as a polygonal pyramid, a hemisphere, or a surface having a roughness, on which concavo-convex portions are randomly arranged. The concave-convex portion may be textured through various etching processes, or may be formed using a patterned sapphire substrate.

The first, second, and third lights from the first, second, and third epitaxial stacks 20, 30, and 40 may have a difference in intensity, which may cause a difference in visibility. According to an exemplary embodiment, the light emitting efficiency may be improved by selectively forming the concave-convex portion on the light emitting surfaces of the first, second, and third epitaxial stacks 20, 30, and 40. In this manner, the difference in visibility between the first, second, and third lights may be reduced. Since light corresponding to the red and/or blue colors has a visibility lower than that of light corresponding to the green color, the difference in visibility may be reduced by texturing the first epitaxial stack 20 and/or the third epitaxial stack 40. In particular, the red color light has a relatively smaller intensity because the red color light is provided from an uppermost portion of the light emitting device. In this case, when the concave-convex portion is formed on the upper surface thereof, a light efficiency may be improved.

The light emitting device having the above-described structure may correspond to a light emitting device capable of displaying various colors, and may be employed in a display device as a pixel. Hereinafter, a display device that employs the light emitting device having the above-described structure as its component will be described.

Figure 3:
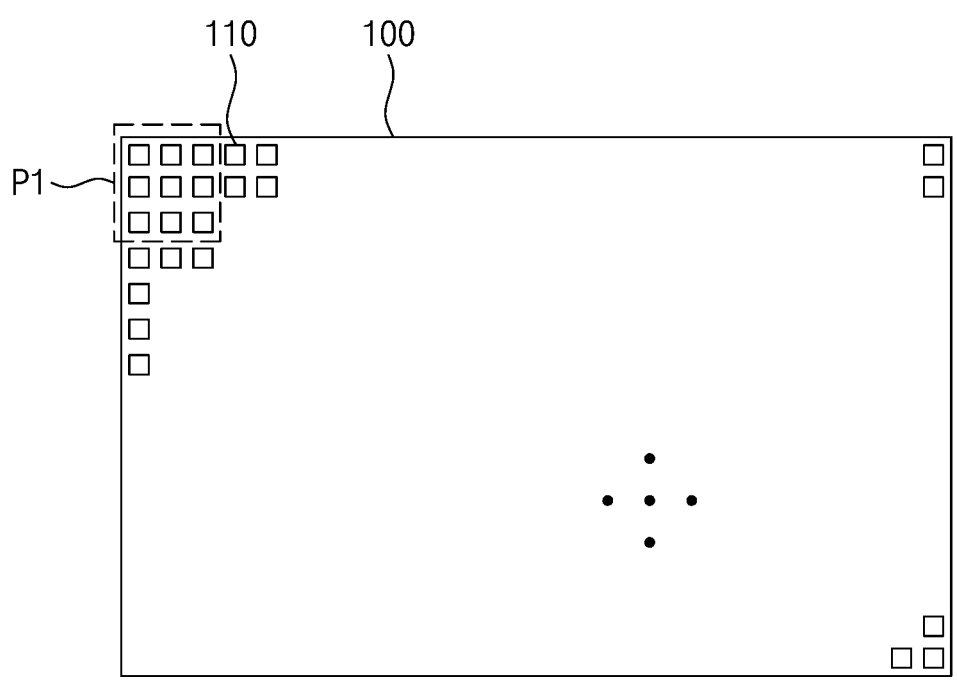
FIG. 3 is a plan view of a display device according to an exemplary embodiment.
Figure 4:
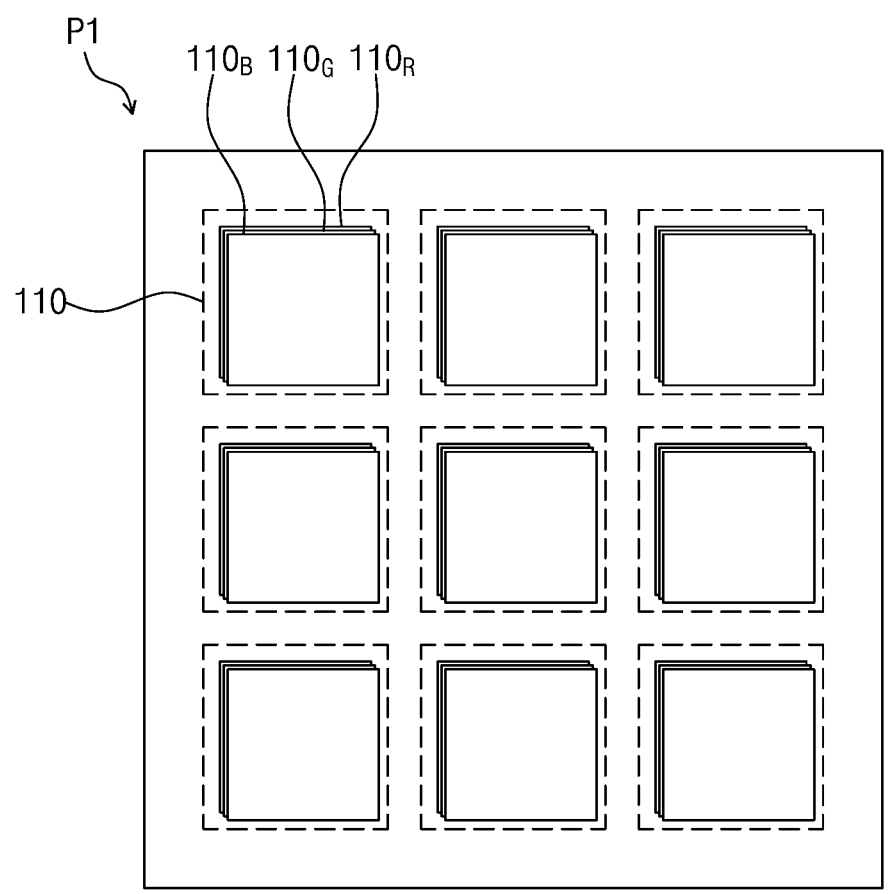
FIG. 4 is an enlarged plan view of a portion P1 of FIG. 3.

FIG. 3 is a plan view of a display device according to an exemplary embodiment, and FIG. 4 is an enlarged plan view of a portion P1 of FIG. 3.

Referring to FIGS. 3 and 4, the display device 100 according to an exemplary embodiment may display arbitrary visual information, such as a text, a video, a photograph, and a 2- or 3-dimensional image.

The display device 100 may have various shapes, such as a closed polygonal shape with straight sides like a rectangular shape, a circular, or oval shape with a curved side, and a semi-circular or semi-oval shape with a straight side and a curved side. In the illustrated exemplary embodiment, the display device has a rectangular shape.

The display device 100 includes a plurality of pixels 110 that display an image. Each pixel 110 may be a minimum unit that displays the image. Each pixel 110 may include the light emitting device having the above-described structure, and may emit a white light and/or a color light.

According to an exemplary embodiment, each pixel 110 includes a first pixel $110_R$ emitting the red color light, a second pixel $110_G$ emitting the green color light, and a third pixel $110_B$ emitting the blue color light. The first, second, and third pixels $110_R$, $110_G$, and $110_E$ may respectively correspond to the third epitaxial stack 40, the second epitaxial stack 30, and first epitaxial stacks 20, of the light emitting device described above.

However, the inventive concepts are not limited to a particular color of light emitted from the first to third pixel $110_R$, $110_G$, and $110_B$. For example, in some exemplary embodiments, at least two pixels may emit the same color light, or the first, second, and third pixels may emit light having different colors from each other, such as yellow, magenta, and cyan, which are different from the above-mentioned colors.

The pixels 110 are arranged in a matrix form. As used herein, the pixels 110 being arranged in the matrix form may refer to the pixels 110 being arranged exactly in line along rows or columns, as well as being arranged along the rows or columns as a whole, while detailed locations of the pixels 110 are being changed, e.g., a zigzag form.

Figure 5:
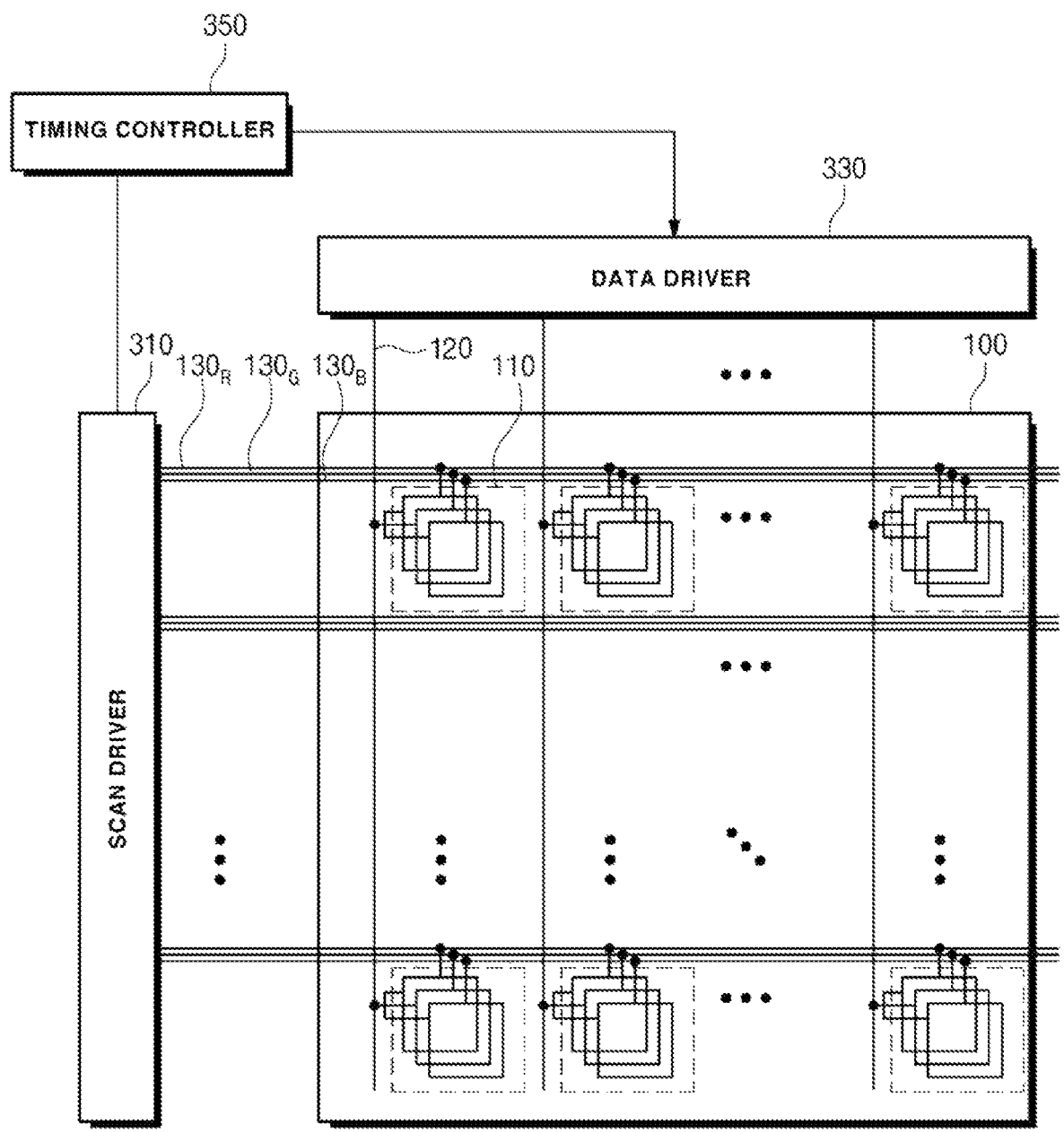
FIG. 5 is a block diagram of a display device according to an exemplary embodiment.

FIG. 5 is a block diagram of a display device 100 according to an exemplary embodiment.

Referring to FIG. 5, the display device 100 according to an exemplary embodiment includes a timing controller 350, a scan driver 310, a data driver 330, a line part, and the pixels. Each of the pixels is individually connected to the scan driver 310 and the data driver 330 through the line part.

The timing controller 350 may receive various control signals and image data for driving the display device 100 from an external source (e.g., a system that transmits the image data). The timing controller 350 may rearrange the received image data and apply the rearranged image data to the data driver 330. In addition, the timing controller 350 may generate scan control signals and data control signals for driving the scan driver 310 and the data driver 330, and apply the generated scan control signals and the data control signals to the scan driver 310 and the data driver 330, respectively.

The scan driver 310 may receive the scan control signals from the timing controller 350 and generate scan signals in response to the scan control signals.

The data driver 330 may receive the data control signals and the image data from the timing controller 350, and generate data signals in response to the data control signals.

The line part includes a plurality of signal lines. In particular, the line part includes scan lines 130 that connect the scan driver 310 and the pixels, and data lines 120 that connect the data driver 330 and the pixels. The scan lines 130 may be connected to each of the pixels, and the scan lines corresponding to each of the pixels are illustrated as first, second, and third scan lines 130$_R$, 130$_G$, and 130$_B$ (hereinafter, the scan lines are indicated with reference numeral 130).

In addition, the line part may further include lines that connect the timing controller 350 and the scan driver 310, the timing controller 350 and the data driver 330, or other components to each other to transmit signals.

The scan lines 130 may apply the scan signals generated by the scan driver 310 to the pixels. The data signals generated by the data driver 330 are applied to the data lines 120.

The pixels are connected to the scan lines 130 and the data lines 120. The pixels may selectively emit light in response to the data signals provided from the data lines 120 when the scan signals from the scan lines 130 are applied thereto. For example, each of the pixels may emit light at a brightness corresponding to the data signal applied thereto during each frame period. In pixels to which the data signals corresponding to a black brightness are applied may not emit light during a corresponding frame period, and thus, a black color may be displayed.

According to an exemplary embodiment, the pixels may be driven in a passive or active matrix manner. When the display device is driven in the active matrix manner, the display device may be driven by being further supplied with first and second pixel power sources in addition to the scan signals and the data signals.

Figure 6:
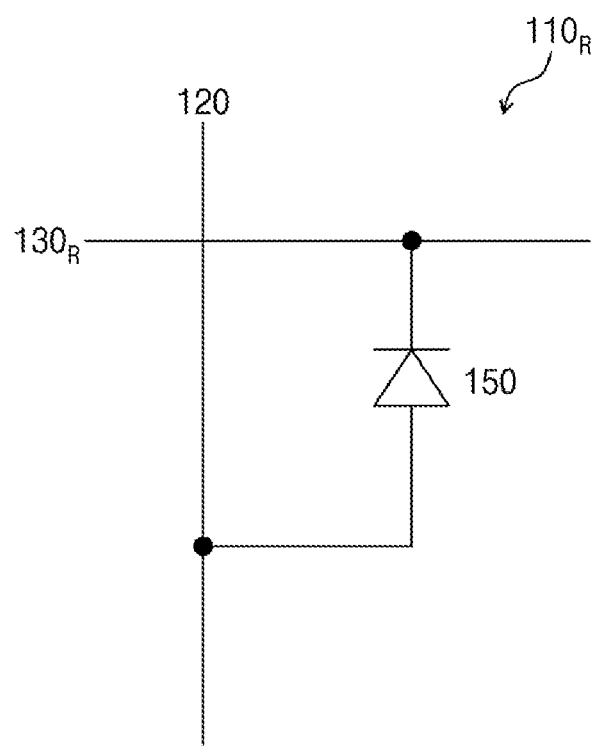
FIG. 6 is a circuit diagram of one pixel for a passive matrix type display device according to an exemplary embodiment.

FIG. 6 is a circuit diagram of one pixel for a passive matrix type display device. The pixel may be one of the pixels, e.g., the red pixel, the green pixel, and the blue pixel, and the first pixel 110$_R$ is exemplarily illustrated. The second and third pixels may be driven in substantially the same manner as the first pixel 110$_R$, and thus, repeated descriptions of circuit diagrams of the second and third pixels will be omitted to avoid redundancy.

Referring to FIG. 6, the first pixel 110$_R$ includes a light emitting device 150 connected between the scan line 130 and the data line 120. The light emitting device 150 corresponds to the first epitaxial stack 20. When a voltage equal to or greater than a threshold voltage is applied to between the p-type semiconductor layer and the n-type semiconductor layer, the first epitaxial stack 20 emits light at a brightness corresponding to a level of the voltage applied thereto. More particularly, the light emission of the first pixel 110$_R$ may be controlled by controlling a voltage of the scan signal applied to the first scan line 130$_R$ and/or a voltage of the data signal applied to the data line 120.

Figure 7:
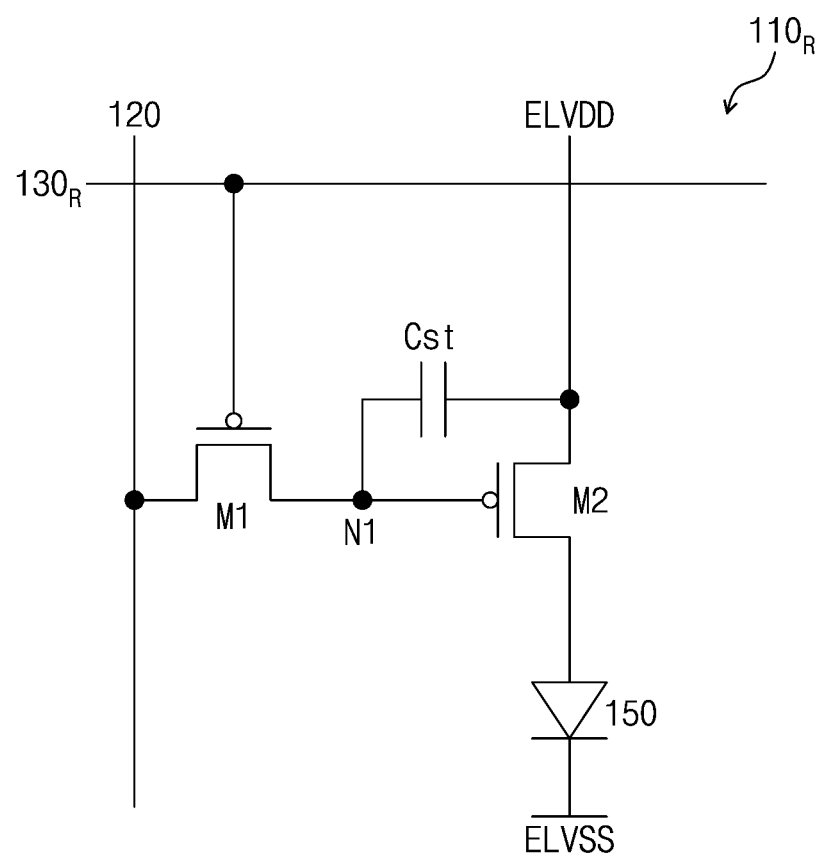
FIG. 7 is a circuit diagram of one pixel for an active matrix type display device according to an exemplary embodiment.

FIG. 7 is a circuit diagram of the first pixel 110$_R$ for an active matrix type display device.

When the display device is the active matrix type display device, the first pixel 110$_R$ may be driven by being further supplied with first and second pixel power sources ELVDD and ELVSS in addition to the scan signals and the data signals.

Referring to FIG. 7, the first pixel 110$_R$ includes a light emitting device 150 and a transistor part connected to the light emitting device 150.

The light emitting device 150 may correspond to the first epitaxial stack 20. The p-type semiconductor layer of the light emitting device 150 may be connected to the first pixel power source ELVDD via the transistor part, and the n-type semiconductor layer of the light emitting device 150 may be connected to the second pixel power source ELVSS. The first pixel power source ELVDD and the second pixel power source ELVSS may have different electric potentials from each other. For example, the second pixel power source ELVSS may have the electric potential lower than the electric potential of the first pixel power source ELVDD by the threshold voltage of the light emitting device. Each of the light emitting devices may emit light at a brightness corresponding to a driving current controlled by the transistor part.

According to the illustrated exemplary embodiment, the transistor part includes first and second transistors M1 and M2 and a storage capacitor Cst. However, a configuration of the transistor part is not limited to that shown in FIG. 7.

The first transistor M1 (e.g., switching transistor) includes a source electrode connected to the data line 120, a drain electrode connected to a first node N1, and a gate electrode connected to the first scan line 130$_R$. The first transistor M1 is turned on to electrically connect the data line 120 and the first node N1 when the scan signal having the voltage sufficient to turn on the first transistor M1 is provided through the first scan line 130$_R$. In this case, the data signal of a corresponding frame is applied to the data line 120, and thus, the data signal is applied to the first node N1. The storage capacitor Cst is charged with the data signal applied to the first node N1.

The second transistor M2 (e.g., driving transistor) includes a source electrode connected to the first pixel power source ELVDD, a drain electrode connected to the n-type semiconductor layer of the light emitting device, and a gate electrode connected to the first node N1. The second transistor M2 controls an amount of the driving current supplied to the light emitting device in response to the voltage of the first node N1.

One electrode of the storage capacitor Cst is connected to the first pixel power source ELVDD, and the other electrode of the storage capacitor Cst is connected to the first node N1. The storage capacitor Cst is charged with the voltage corresponding to the data signal applied to the first node N1, and maintains the charged voltage until a data signal of a next frame is provided.

FIG. 7 exemplarily illustrates the transistor part including two transistors. However, the inventive concepts are not limited to a particular number of the transistors included in the transistor part, and in other exemplary embodiments, the configuration of the transistor part may be changed in various ways. For example, the transistor part may include more transistors and more capacitors. In addition, in the illustrated exemplary embodiment, configurations of the first and second transistors, the storage capacitor, and the lines are not shown in detail, however, the first and second transistors, the storage capacitor, and the lines may be changed in various ways as known in the art.

The structure of the above-described pixel may be changed in various ways. More particularly, the pixel may be implemented as a package structure, which will be described in more detail. Hereinafter, the package will be described with reference to the passive matrix-type pixel implemented in a package.

Figure 8A:
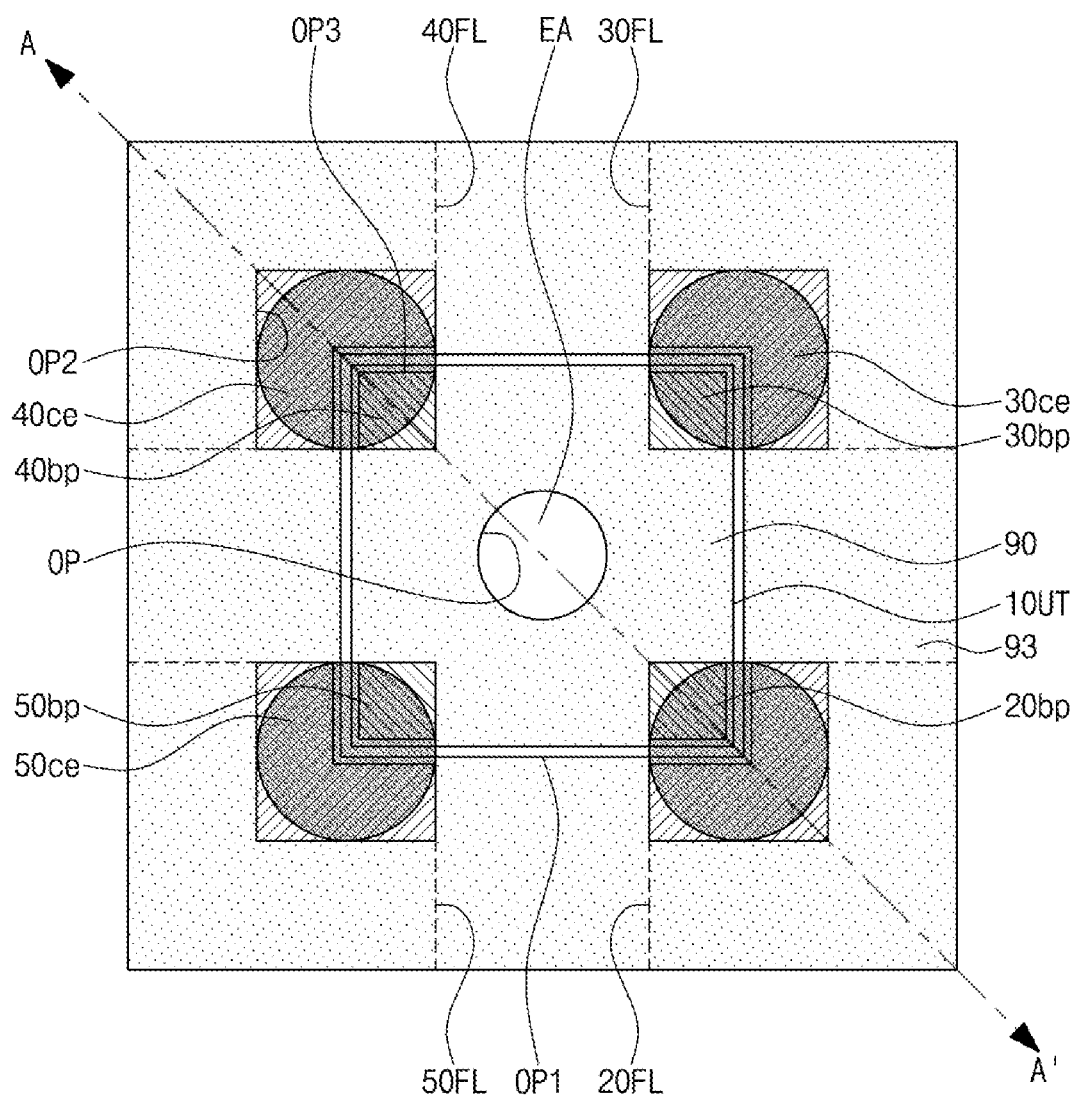
FIG. 8A is a plan view of a light emitting device package according to an exemplary embodiment.
Figure 8B:
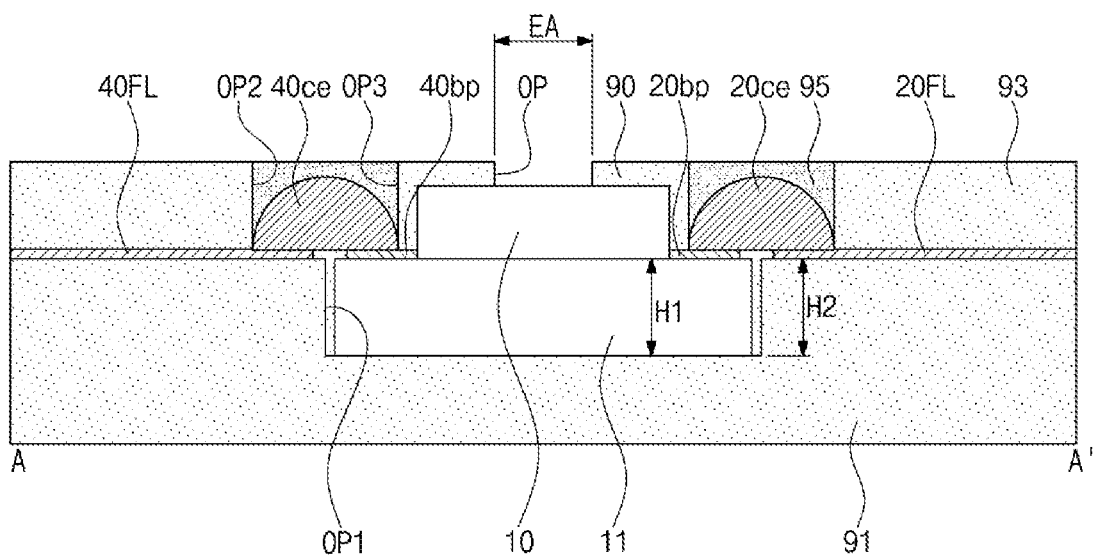
FIG. 8B is a cross-sectional view taken along line A-A' of FIG. 8A according to an exemplary embodiment.

FIG. 8A is a plan view of a light emitting device package according to an exemplary embodiment, and FIG. 8B is a cross-sectional view taken along line A-A' of FIG. 8A.

In FIGS. 8A and 8B, the light emitting device package is illustrated in a simplified form, and first, second, third, and fourth bump electrodes, which will be described later, are simply shown as being formed on a flat light emitting device. In particular, the light emitting device is shown as having a flat upper surface, however, the light emitting device may have a step difference and/or an inclination on its upper surface, and detailed configurations of the light emitting structure will be shown in FIGS. 9A to 9C.

Referring to FIGS. 8A and 8B, the light emitting device package according to an exemplary embodiment includes a base substrate 91, outer electrodes disposed on the base substrate 91, a light emitting device 10UT disposed on the base substrate 91, and connection electrodes that connect the light emitting device 10UT and the outer electrodes.

The base substrate 91 entirely supports a light emitting structure 10 and a substrate 11, and connects the light emitting structure 10 to external devices.

The base substrate 91 may have substantially a rectangular plate shape. The base substrate 91 may include a first recess portion OP1 defined at a center thereof and recessed in a downward direction from an upper surface thereof. The first recess portion OP1 may be defined by a bottom surface and a sidewall, which may be formed by removing a portion of the base substrate 91.

The first recess portion OP1 may be formed to correspond to a shape and a size of the light emitting device 10UT, e.g., a shape and a size of the substrate 11 of the light emitting device 10UT, and may be formed to be substantially the same as or slightly greater than the size of the substrate 11, such that the light emitting device 10UT may be easily inserted into the first recess portion OP1 of the base substrate 91. In the illustrated exemplary embodiment, the light emitting device 10UT and the first recess portion OP1 have substantially a rectangular shape when viewed in a plan view.

The light emitting device 10UT includes the substrate 11 and the light emitting structure 10. The light emitting structure 10 includes the epitaxial stacks described above, and the bump electrodes connected to the epitaxial stacks. The bump electrodes are electrically connected to the epitaxial stacks, and at least a portion of the bump electrodes is disposed on the substrate 11. In the illustrated exemplary embodiment, the bump electrodes may be respectively disposed at corners of the substrate 11 of the light emitting device 10UT, and the bump electrodes may be spaced apart from each other. The bump electrodes may include first, second, third, and fourth bump electrodes 20*bp*, 30*bp*, 40*bp*, and 50*bp* respectively disposed at the corners of the light emitting device 10UT having a substantially rectangular shape. According to an exemplary embodiment, the first, second, third, and fourth bump electrodes 20*bp*, 30*bp*, 40*bp*, and 50*bp* are disposed not to overlap with a light emission area EA. Electrical relationships between each epitaxial stack and the first, second, third, and fourth bump electrodes 20*bp*, 30*bp*, 40*bp*, and 50*bp* will be described later.

A portion of the light emitting device 10UT, such as portions of the substrate 11 and the light emitting structure 10, may be embedded in the base substrate 91 having substantially the plate shape. In the illustrated exemplary embodiment, the substrate 11 of the light emitting device 10UT is disposed in the first recess portion OP1 of the base substrate 91. Accordingly, a rear surface and a side surface of the substrate 11 are surrounded by the base substrate 91. In the illustrated exemplary embodiment, a thickness H1 of the substrate 11 and a depth H2 of the first recess portion OP1 of the base substrate 91 may be substantially the same as each other. Since the thickness H1 of the substrate 11 and the depth H2 of the first recess portion OP1 of the base substrate 91 are substantially the same as each other, an upper surface of the substrate 11 and an upper surface of the base substrate 91 may be disposed on the same plane.

According to an exemplary embodiment, an adhesive may be provided between the substrate 11 of the light emitting device 10UT and the base substrate 91, such that the light emitting device 10UT and the base substrate 91 may be securely attached to each other by the adhesive. In this case, the thickness of the substrate 11 may be determined by taking into account a thickness of the adhesive. For example, the thickness of the substrate 11 may be formed to be thinner than when the adhesive is not provided, so that the upper surface of the substrate 11 and the upper surface of the base substrate 91 are aligned with each other even though the adhesive is provided.

The adhesive may include various materials, e.g., an acrylic-based polymer, a nitrile-based polymer, a silicone rubber, a butyl rubber, a styrene block copolymer, a vinyl ether-based polymer, a urethane polymer, and an epoxy polymer. The adhesive may be optically clear, however, the adhesive in some exemplary embodiments may have a white color, a black color, or others. The color of the adhesive may be determined by a material that reflects light in an upward direction, such that light emitted from the light emitting device 10UT travels in the upward direction as much as possible, or may be determined by a material that absorbs or blocks light traveling in the downward direction. In addition, the adhesive may include a fluorescent substance therein to enhance an extraction efficiency of light traveling in the upward direction. The fluorescent substance may be used as a light conversion layer that converts light from the light emitting device 10UT to a light having a wavelength band of a light required by a user.

The outer electrodes are disposed on the base substrate 91. The outer electrodes may include wires for connection to the external device. The outer electrodes may be provided to correspond to the number of components that needs to be electrically connected to the light emitting device 10UT. Additional wires may be further connected to the outer electrodes, and the additional wires may be electrically connected to the external device.

The outer electrodes may be disposed at various positions in various forms. In the illustrated exemplary embodiment, when the base substrate 91 has substantially the rectangular shape, the outer electrodes may be respectively disposed at the corners of the base substrate 91, and the outer electrodes may be spaced apart from each other. The outer electrodes may not be disposed in a position, in which the first recess portion OP1 is defined, and may have a chamfered shape in the position where the first recess portion OP1 is defined.

According to an exemplary embodiment, the outer electrodes may include first, second, third, and fourth outer electrodes 20FL, 30FL, 40FL, and 50FL. The first, second, third, and fourth outer electrodes 20FL, 30FL, 40FL, and 50FL may be disposed at positions respectively adjacent to the first, second, third, and fourth bump electrodes 20*bp*, 30*bp*, 40*bp*, and 50*bp* to be connected to the first, second, third, and fourth bump electrodes 20*bp*, 30*bp*, 40*bp*, and 50*bp*, respectively. More particularly, the first outer electrode 20FL is disposed at a position adjacent to the first bump electrode 20*bp*, the second outer electrode 30FL is disposed at a position adjacent to the second bump electrode 30*bp*, the third outer electrode 40FL is disposed at a position adjacent to the third bump electrode 40*bp*, and the fourth outer electrode 50FL is disposed at a position adjacent to the fourth bump electrode 50*bp*.

According to an exemplary embodiment, the first, second, third, and fourth outer electrodes 20FL, 30FL, 40FL, and 50FL, and the first, second, third, and fourth bump electrodes 20*bp*, 30*bp*, 40*bp*, and 50*bp* may be disposed on substantially the same plane. Although the first, second, third, and fourth outer electrodes 20FL, 30FL, 40FL, and 50FL and the first, second, third, and fourth bump electrodes 20*bp*, 30*bp*, 40*bp*, and 50*bp* are not disposed completely on the same plane, they may be provided on an approximately coplanar plane due to small height differences therebetween.

A first insulating member 93 is disposed on the base substrate 91. The first insulating member 93 is disposed on the base substrate 91 except for the first recess portion OP1. The first insulating member 93 is provided with second recess portions OP2 to expose a portion of the first, second, third, and fourth outer electrodes 20FL, 30FL, 40FL, and 50FL in areas adjacent to the first, second, third, and fourth bump electrodes 20*bp*, 30*bp*, 40*bp*, and 50*bp*. Each of the second recess portions OP2 may be defined by a sidewall, which may be formed by removing a portion of the first insulating member 93 and an upper surface of the exposed outer electrodes. The second recess portions OP2 have an open shape toward the upward direction of the first insulating member 93 and toward the bump electrodes corresponding to the exposed outer electrodes. For example, the second recess portion, through which the first outer electrode 20FL is exposed among the second recess portions OP2, has the open shape toward the upward direction of the first insulating member 93 and toward the first bump electrode 20*bp*.

A second insulating member 90 is disposed on the light emitting device 10UT. The second insulating member 90 is provided with third recess portions OP3 to expose a portion of the first, second, third, and fourth bump electrodes 20*bp*, 30*bp*, 40*bp*, and 50*bp* in areas adjacent to the first, second, third, and fourth outer electrodes 20FL, 30FL, 40FL, and 50FL. Each of the third recess portions OP3 has an open shape toward the upward direction of the second insulating member 90 and toward the outer electrodes corresponding to the exposed bump electrodes. For example, the third recess portion, through which the third bump electrode 40*bp* is exposed among the third recess portions OP3, has the open shape toward the upward direction of the second insulating member 90 and toward the second outer electrode 30FL.

In addition, the second insulating member 90 is disposed on the light emitting device 10UT except for the light emission area EA. As such, the second insulating member 90 is provided with an opening OP to expose an upper surface of the uppermost epitaxial stack, and the portion exposed through the opening OP corresponds to the light emission area EA. In the illustrated exemplary embodiment, the light emission area EA may have substantially a circular shape. However, the inventive concepts are not limited to a particular shape of the light emission area EA, and in some exemplary embodiments, the light emission area EA may have various shapes, e.g., a polygonal shape, a closed shape with at least one straight line and at least one curved line, or a closed shape with a curved line.

The connection electrodes are disposed on the outer electrodes and the bump electrodes, which are exposed through the second and third recess portions OP2 and OP3, to connect the outer electrodes and the bump electrodes. The connection electrodes may include first, second, third, and fourth connection electrodes 20*ce*, 30*ce*, 40*ce*, and 50*ce*, each electrically connecting a corresponding outer electrode to a corresponding bump electrode. In particular, the first, second, third, and fourth connection electrodes 20*ce*, 30*ce*, 40*ce*, and 50*ce* may be disposed between the first, second, third, and fourth outer electrodes 20FL, 30FL, 40FL, and 50FL and the first, second, third, and fourth bump electrodes 20*bp*, 30*bp*, 40*bp*, and 50*bp*, and connect the first, second, third, and fourth outer electrodes 20FL, 30FL, 40FL, and 50FL to the first, second, third, and fourth bump electrodes 20*bp*, 30*bp*, 40*bp*, and 50*bp* in a one-to-one correspondence. The first connection electrode 20*ce* is disposed at portions of the first outer electrode 20FL and the first bump electrode 20*bp* exposed by the second and third recess portions OP2 and OP3. As the first connection electrode 20*ce* having a single unitary form is disposed on the first outer electrode 20FL and the first bump electrode 20*bp*, the first outer electrode 20FL and the first bump electrode 20*bp* are connected to each other. The second connection electrode 30*ce* is disposed at portions of the second outer electrode 30FL and the second bump electrode 30*bp* exposed by the second and third recess portions OP2 and OP3. As the second connection electrode 30*ce* having a single unitary form is disposed on the second outer electrode 30FL and the second bump electrode 30*bp*, the second outer electrode 30FL and the second bump electrode 30*bp* are connected to each other. In substantially the same manner, the third outer electrode 40FL and the third bump electrode 40*bp* are connected to each other by the third connection electrode 40*ce*, and the fourth outer electrode 50FL and the fourth bump electrode 50*bp* are connected to each other by the fourth connection electrode 50*ce*.

In the illustrated exemplary embodiment, the first, second, third, and fourth bump electrodes 20*bp*, 30*bp*, 40*bp*, and 50*bp* and the first, second, third, and fourth outer electrodes 20FL, 30FL, 40FL, and 50FL may be disposed on substantially the same plane as each other, such that the first, second, third, and fourth bump electrodes 20*bp*, 30*bp*, 40*bp*, and 50*bp* are stably connected to the first, second, third, and fourth outer electrodes 20FL, 30FL, 40FL, and 50FL by the first, second, third, and fourth connection electrodes 20*ce*, 30*ce*, 40*ce*, and 50*ce*. In this case, it is not necessary that each of the first, second, third, and fourth bump electrodes 20*bp*, 30*bp*, 40*bp*, and 50*bp* and the first, second, third, and fourth outer electrodes 20FL, 30FL, 40FL, and 50FL are arranged on the same plane, as long as a corresponding pair of the bump electrode and the outer electrode are disposed on the same plane. This is because an adhesive force of the connection electrodes may be weakened when a height between a pair of the bump electrode and the outer electrode is different. As such, according to an exemplary embodiments, the connection electrodes may be manufactured by forming a conductive material, which may form the connection electrodes, on portions of the bump electrodes and the outer electrodes exposed by the second and third recess portions OP2 and OP3, through a printing process, e.g., a silkscreen.

According to an exemplary embodiment, the first, second, third, and fourth bump electrodes 20*bp*, 30*bp*, 40*bp*, and 50*bp* are connected to the first, second, third, and fourth outer electrodes 20FL, 30FL, 40FL, and 50FL by the first, second, third, and fourth connection electrodes 20*ce*, 30*ce*, 40*ce*, and 50*ce* in an outer portion except for the light emission area EA, so as not to overlap with the light emission area EA. More particular, the first, second, third, and fourth connection electrodes 20*ce*, 30*ce*, 40*ce*, and 50*ce* may not overlap with the light emission area EA.

The second and third recess portions OP2 and OP3, in which the connection electrodes are disposed, may be substantially filled with a cover member 95. In addition, the cover member 95 may substantially fill a space between the first recess portion OP1 and the light emitting device 10UT.

According to an exemplary embodiment, at least one of the base substrate 91, the first insulating member 93, the second insulating member 90, and the cover member 95 may include a light shielding material. In this manner, colors of light emitted from adjacent light emitting device packages may be prevented from being mixed. In addition, light traveling towards a direction, to which the front surface of the base substrate 91 faces, may be increased in each light emitting device package, and suppress light traveling in other directions, e.g., a direction to which the side surface of the base substrate 91 faces or a direction to which the rear surface of the base substrate 91 faces. According to an exemplary embodiment, each of the base substrate 91, the first insulating member 93, the second insulating member 90, and the cover member 95 may include the light shielding material.

Further, since the first insulating member 93, the second insulating member 90, and the cover member 95 are disposed on the base substrate 91, a rigidity of the light emitting device package may be increased. In particular, since the cover member 95 is disposed and cured in an inner space of the first recess portion OP1, the second recess portion OP2, and the third recess portion OP3, the adhesive force between the base substrate 91, the first insulating member 93, the second insulating member 90, and the cover member 95 may be increased. As such, the overall rigidity of the light emitting device package may further be increased.

According to an exemplary embodiment, at least one of the first insulating member 93, the second insulating member 90, and the cover member 95, which are disposed on the base substrate 91, may include an organic polymer material, without being limited thereto.

According to an exemplary embodiment, the outer electrodes are formed outside the light emitting device 10UT to have a relatively larger area than the bump electrodes of the light emitting device 10UT, and thus, the external devices may be easily connected to the outer electrodes directly or through separate lines. For example, the first, second, and third light emitting signal lines that apply the light emitting signals and the common line that applies the common voltage may be connected to the light emitting device 10UT. In the illustrated exemplary embodiment, the first, second, and third light emitting signal lines may correspond to the first, second, and third scan lines, respectively, and the common line may correspond to the data line.

When the separate lines are directly connected to the outer electrodes, a separate opening may be further formed on a portion of the first insulating member 93 for the connection between the outer electrodes and the separate lines.

According to an exemplary embodiment, the first, second, third, and fourth bump electrodes 20bp, 30bp, 40bp, and 50bp may be provided in the vicinity of an edge of the light emitting device 10UT, particularly, at the corner of the light emitting device 10UT, and the first, second, third, and fourth bump electrodes 20bp, 30bp, 40bp, and 50bp may be connected to the first, second, third, and fourth outer electrodes 20FL, 30FL, 40FL, and 50FL. Accordingly, the possibility of disconnection is reduced as compared to when external lines are directly connected to the first, second, third, and fourth bump electrodes 20bp, 30bp, 40bp, and 50bp, while securing the light emission area EA.

In the light emitting device package according to an exemplary embodiment, the light emitting device mounted on the base substrate emits light to a direction, to which the front surface of the base substrate faces. As such, as compared to a conventional light emitting device package, in which light is emitted towards the base substrate, light emitted from the light emitting device of the light emitting device package according to an exemplary embodiment directly travels in an upward direction without passing through the base substrate. In this manner, the light emitting efficiency of light emitted from the light emitting device may be improved. In addition, since the base substrate 91 may include the light shielding material, e.g., a black-colored material, the color mixture between light emitted from adjacent light emitting devices may be reduced, thereby improving the contrast.

In the light emitting device package according to an exemplary embodiment, since the light emitting device is mounted on the base substrate 91, the light emitting device may be easily repaired when it is defective. As described above, the light emitting device may have substantially the same thickness as the depth of the first recess portion. As such, the upper surface of the base substrate and the upper surface of the light emitting device are disposed on substantially the same plane, and the connection electrodes are formed on the upper surface of the light emitting device and the upper surface of the base substrate. Accordingly, when the light emitting device is defective, the light emitting device may be easily picked up and removed from the first recess portion OP1 in the upward direction after irradiating the laser beam to the connection electrodes.

According to an exemplary embodiment, the light emitting device emits light to a direction, to which the front surface of the base substrate faces, as opposed to a direction to which the rear surface of the base substrate faces. As such, the substrate 11 of the light emitting device is provided on the base substrate 91, and the light emitting structure is spaced apart from the base substrate 91 with the substrate 11 interposed therebetween. In this manner, when defects occur in the light emitting device, the defective light emitting device may be separated from the light emitting device package, for example, by pressing the light emitting device from a lower side to the upward direction using an eject pin. In this case, even when the light emitting device package is pressed from the lower side to the upper direction using the eject pin, the damage to the light emitting structure may be remarkably reduced because the substrate 11 is disposed at the lower side. As such, the light emitting device package may be easily repaired by removing the defective light emitting device from the light emitting device package without causing damage thereto, and by placing a new or repaired light emitting device at a position from which the defective light emitting device has been removed.

Figure 9A:
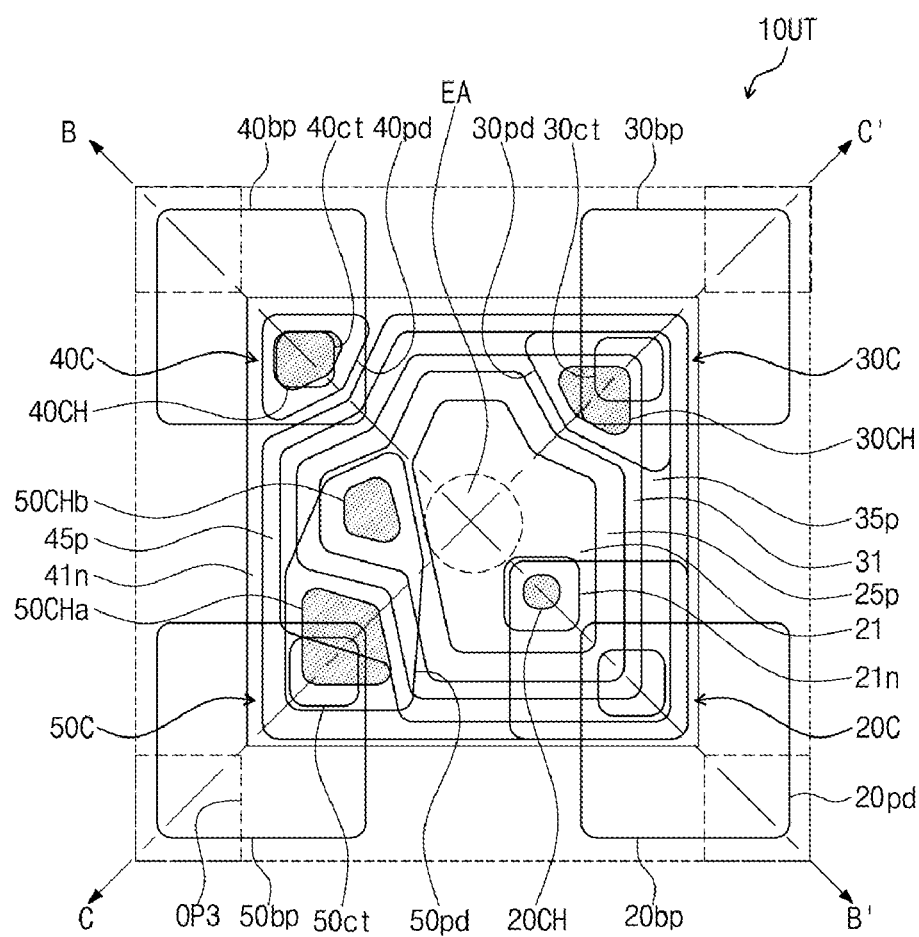
FIG. 9A is a plan view of a light emitting device according to an exemplary embodiment.

According to an exemplary embodiment, the light emitting device may be implemented in various ways. FIG. 9A is a plan view of a light emitting device according to an exemplary embodiment, and FIGS. 9B and 9C are cross-sectional views respectively taken along lines B-B' and C-C' of FIG. 9A.

Figure 9B:
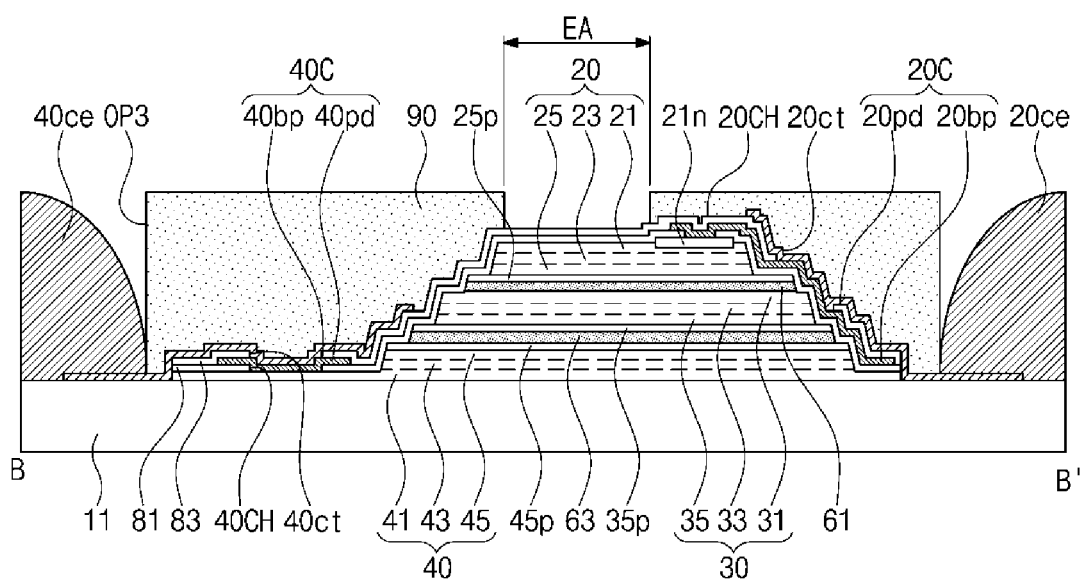
FIGS. 9B and 9C are cross-sectional views taken along lines B-B' and C-C' of FIG. 9A, respectively.
Figure 9C:
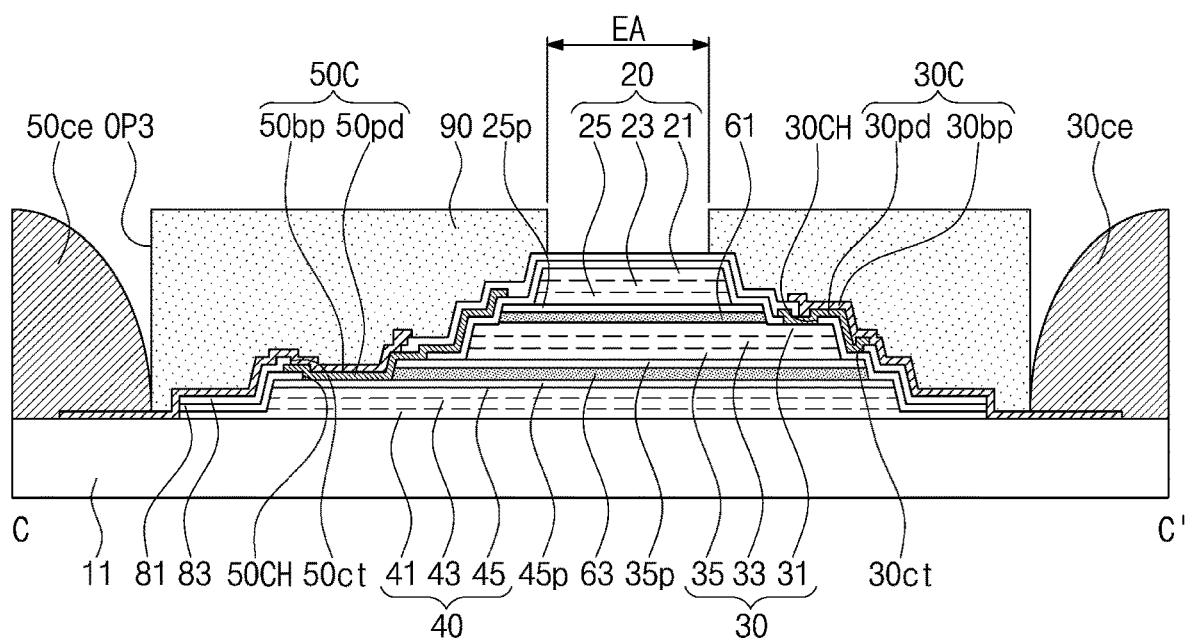

Referring to FIGS. 9A, 9B, and 9C, the light emitting device includes a light emission area, in which the epitaxial stacks are stacked when viewed in a plan view. According to an exemplary embodiment, the stack structure may be changed depending on the polarity type of the semiconductor layer of the first, second, and third epitaxial stacks 20, 30, and 40 the common voltage is applied to. Hereinafter, the light emitting device will exemplarily be described as the common voltage being applied to a p-type semiconductor layer of the epitaxial stacks.

The epitaxial stacks include the third epitaxial stack 40, the second epitaxial stack 30, and the first epitaxial stack 20, which are stacked on the substrate 11.

Each of the first, second, and third epitaxial stacks 20, 30, and 40 includes a p-type semiconductor layer, an active layer disposed on the p-type semiconductor layer, and an n-type semiconductor layer disposed on the active layer. More particularly, the first epitaxial stack 20 includes the first p-type semiconductor layer 25, the first active layer 23 disposed on the first p-type semiconductor layer 25, and the first n-type semiconductor layer 21 disposed on the first active layer 23. The second epitaxial stack 30 includes the second p-type semiconductor layer 35, the second active layer 33 disposed on the second p-type semiconductor layer 35, and the second n-type semiconductor layer 31 disposed on the second active layer 33. The third epitaxial stack 40 includes the third n-type semiconductor layer 41, the third active layer 43 disposed on the third n-type semiconductor layer 41, and the third p-type semiconductor layer 45 disposed on the third active layer 43.

The third p-type contact electrode 45*p* directly making contact with the third p-type semiconductor layer 45, the second adhesive layer 63, and the second p-type contact electrode 35*p* are sequentially disposed on the third p-type semiconductor layer 45 of the third epitaxial stack 40. The second p-type contact electrode 35*p* directly makes contact with the second p-type semiconductor layer 35 of the second epitaxial stack 30.

The first adhesive layer 61 and the first p-type contact electrode 25*p* are sequentially disposed on the second n-type semiconductor layer 31 of the second epitaxial stack 30. The first p-type contact electrode 25*p* directly makes contact with the first p-type semiconductor layer 25 of the first epitaxial stack 20.

The first n-type contact electrode 21*n* is disposed on the first n-type semiconductor layer 21 of the first epitaxial stack 20.

A single- or multi-layer insulating layer is disposed on the substrate 11, on which the first, second, and third epitaxial stacks 20, 30, and 40 are stacked. In the illustrated exemplary embodiment, a first insulating layer 81 and a second insulating layer 83 are disposed on portions of the side surfaces and the upper surfaces of the first, second, and third epitaxial stacks 20, 30, and 40 to cover the stacked structure of the first, second, and third epitaxial stacks 20, 30, and 40. The first and/or second insulating layers 81 and 83 may include various organic/inorganic insulating materials, and the material and the shape of the first and/or second insulating layers 81 and 83 may be varied. For example, in some exemplary embodiments, the first and/or second insulating layers 81 and 83 may include a distributed Bragg reflector (DBR). In other exemplary embodiments, the first and/or second insulating layers 81 and 83 may include a black-colored organic polymer layer. In addition, in some exemplary embodiments, a metal reflection layer that is in a floating state may be further disposed on the first and/or second insulating layers 81 and 83. According to an exemplary embodiment, the insulating layer may be formed by depositing two or more insulating layers having different refractive indices from each other.

The contact part is disposed in the pixel to connect the line part to the first, second, and third epitaxial stacks 20, 30, and 40. The contact part includes a first contact part 20C to apply the light emitting signal to the first epitaxial stack 20, a second contact part 30C to apply the light emitting signal to the second epitaxial stack 30, a third contact part 40C to apply the light emitting signal to the third epitaxial stack 40, and a fourth contact part 50C to apply the common voltage to the first, second, and third epitaxial stacks 20, 30, and 40.

The first, second, third, and fourth contact parts 20C, 30C, 40C, and 50C may be disposed at various positions when viewed in a plan view. For example, when the light emitting device has substantially a quadrangular shape, the first, second, third, and fourth contact parts 20C, 30C, 40C, and 50C may be disposed in areas respectively corresponding to corners of the quadrangular shape. In this case, the contact part may not overlap with the light emission area EA. However, the inventive concepts are not limited to particular positions of the first, second, third, and fourth contact parts 20C, 30C, 40C, and 50C, and the positions thereof may be changed in various ways depending on the shape of the light emitting device.

The first, second, third, and fourth contact parts 20C, 30C, 40C, and 50C may include first, second, third, and fourth pads 20*pd*, 30*pd*, 40*pd*, and 50*pd*, respectively, and the first, second, third, and fourth bump electrodes 20*bp*, 30*bp*, 40*bp*, and 50*bp*, respectively.

The first, second, third, and fourth pads 20*pd*, 30*pd*, 40*pd*, and 50*pd* are spaced apart and insulated from each other. A portion of each of the first, second, third, and fourth bump electrodes 20*bp*, 30*bp*, 40*bp*, and 50*bp* may be formed over edges of the first, second, and third epitaxial stacks 20, 30, and 40, and may extend outside of the first, second, and third epitaxial stacks 20, 30, and 40 to be disposed near the substrate 11. The first, second, third, and fourth bump electrodes 20*bp*, 30*bp*, 40*bp*, and 50*bp* may cover at least a portion of the side surfaces of the active layers 23, 33, and 43 of the first, second, and third epitaxial stacks 20, 30, and 40. In this manner, heat generated from the first, second, and third epitaxial stacks 20, 30, and 40 may be easily discharged through the first, second, third, and fourth bump electrodes 20*bp*, 30*bp*, 40*bp*, and 50*bp*. As such, deterioration of the first, second, and third epitaxial stacks 20, 30, and 40 may be suppressed due to the heat-discharge effect of the first, second, third, and fourth bump electrodes 20*bp*, 30*bp*, 40*bp*, and 50*bp*.

The first contact part 20C includes the first pad 20*pd* and the first bump electrode 20*bp* electrically connected to each other. The first pad 20*pd* is disposed on the first n-type contact electrode 21*n* of the first epitaxial stack 20 and connected to the first n-type contact electrode 21*n* through a first contact hole 20CH defined through the first insulating layer 81. At least a portion of the first bump electrode 20*bp* overlaps with the first pad 20*pd*. The first bump electrode 20*bp* is connected to the first pad 2o*pd* through a first through hole 20*ct* with the second insulating layer 83 interposed there between in an area where the first bump electrode 20*bp* overlaps with the first pad 20*pd*. According to an exemplary embodiment, the first pad 20*pd* and the first bump electrode 20*bp* have similar shape as each other and at least partially overlap with each other. However, the inventive concepts are not limited thereto, and in some exemplary embodiments, the shapes and sizes of the first pad 20*pd* and the first bump electrode 20*bp* may be different from each other.

The second contact part 30C includes the second pad 30*pd* and the second bump electrode 30*bp* electrically connected to each other. The second pad 30*pd* is disposed on the second n-type semiconductor layer 31 of the second epitaxial stack 30 and connected to the second n-type semiconductor layer 31 through a second contact hole 30CH defined through the first insulating layer 81. At least a portion of the second bump electrode 30*bp* overlaps with the second pad 30*pd*. The second bump electrode 30*bp* is connected to the second pad 3o*pd* through a second through hole 30*ct* with the second insulating layer 83 interposed there between in an area where the second bump electrode 30*bp* overlaps with the second pad 30*pd*.

The third contact part 40C includes the third pad 40*pd* and the third bump electrode 40*bp* electrically connected to each other. The third pad 40*pd* is disposed on the third n-type semiconductor layer 41 of the third epitaxial stack 40 and connected to the third n-type semiconductor layer 41 through a third contact hole 40CH defined through the first insulating layer 81. At least a portion of the third bump electrode 40*bp* overlaps with the third pad 40*pd*. The third bump electrode 40*bp* is connected to the third pad 40*pd* through a third through hole 40*ct* with the second insulating layer 83 interposed there between in an area where the third bump electrode 40*bp* overlaps with the third pad 40*pd*.

The fourth contact part 50C includes the fourth pad 50*pd* and the fourth bump electrode 50*bp* electrically connected to each other. The fourth pad 50*pd* is connected to the first, second, and third p-type semiconductor layers 25, 35, and 45 of the first, second, and third epitaxial stacks 20, 30, and 40 through a first sub-contact hole 50CHa and a second sub-contact hole 50CHb defined on the first, second, and third p-type contact electrodes 25*p*, 35*p*, and 45*p* of the first, second, and third epitaxial stacks 20, 30, 40. In particular, the fourth pad 50*pd* is connected to the first p-type contact electrode 25*p* through the first sub-contact hole 50CHa defined above the first p-type contact electrode 25*p* and substantially simultaneously connected to the second and third p-type contact electrodes 35*p* and 45*p* through the second sub-contact hole 50CHb defined above the second and third p-type contact electrodes 35*p* and 45*p*. In this case, since the fourth pad 50*pd* may be substantially simultaneously connected to the second and third p-type contact electrodes 35*p* and 45*p* through one second sub-contact hole 50CHb without respectively forming contact holes for the second and third p-type contact electrodes 35*p* and 45*p*, a manufacturing process of the light emitting device may be simplified, and an area occupied by the contact holes in the light emitting device may be reduced. At least a portion of the fourth bump electrode 50*bp* overlaps with the fourth pad 50*pd*. The fourth bump electrode 50*bp* is connected to the fourth pad 50*pd* through a fourth through hole 50*ct* with the second insulating layer 83 interposed there between in an area where the fourth bump electrode 50*bp* overlaps with the fourth pad 50*pd*.

In the illustrated exemplary embodiment, the first, second, third, and fourth bump electrodes 20*bp*, 30*bp*, 40*bp*, and 50*bp* may have a shape extending outside the first, second, and third epitaxial stacks 20, 30, and 40 of the light emitting structure, and may be disposed on portions of the substrate 11 that do not overlap with the first, second, and third epitaxial stacks 20, 30, and 40 when viewed in a plan view.

In the illustrated exemplary embodiment, the first, second, third, and fourth bump electrodes 20*bp*, 30*bp*, 40*bp*, and 50*bp* may have substantially the same shape and area when viewed in a plan view, however, the inventive concepts are not limited thereto. In some exemplary embodiments, the first, second, third, and fourth bump electrodes 20*bp*, 30*bp*, 40*bp*, and 50*bp* may have various shapes and areas.

In the illustrated exemplary embodiment, at least a portion of the first, second, third, and fourth bump electrodes 20*bp*, 30*bp*, 40*bp*, and 50*bp* is disposed on the substrate 11 and connected to the first, second, third, and fourth connection electrodes 20*ce*, 30*ce*, 40*ce*, and 50*ce* disposed on the same plane as the substrate 11. However, the inventive concepts are not limited thereto, and in some exemplary embodiments, the first, second, third, and fourth bump electrodes 20*bp*, 30*bp*, 40*bp*, and 50*bp* may be partially disposed on at least one of the first, second, and third epitaxial stacks 20, 30, and 40.

Figure 10:
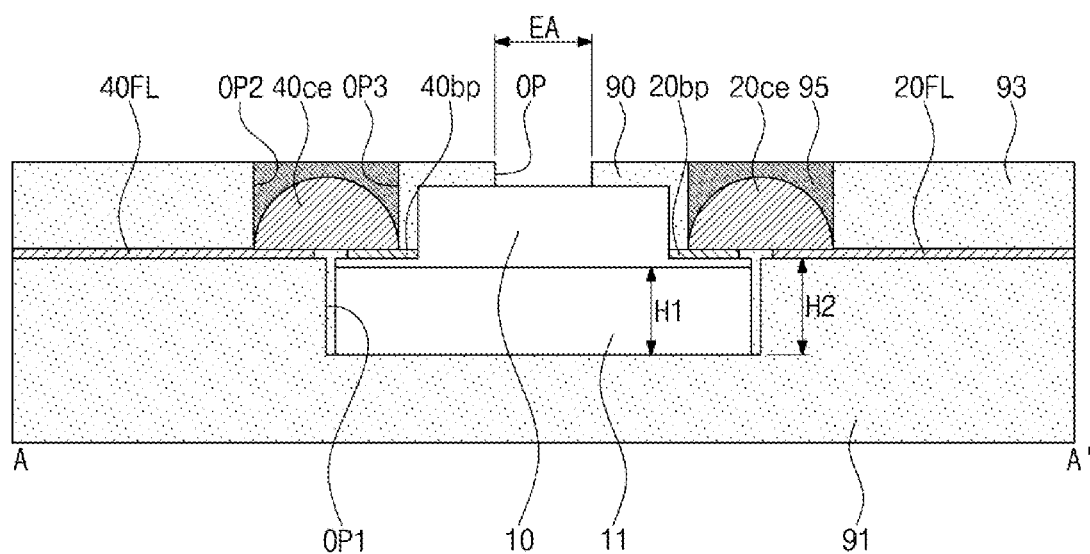
FIG. 10 is a cross-sectional view taken along line A-A' of FIG. 8A according to another exemplary embodiment.
Figure 11A:
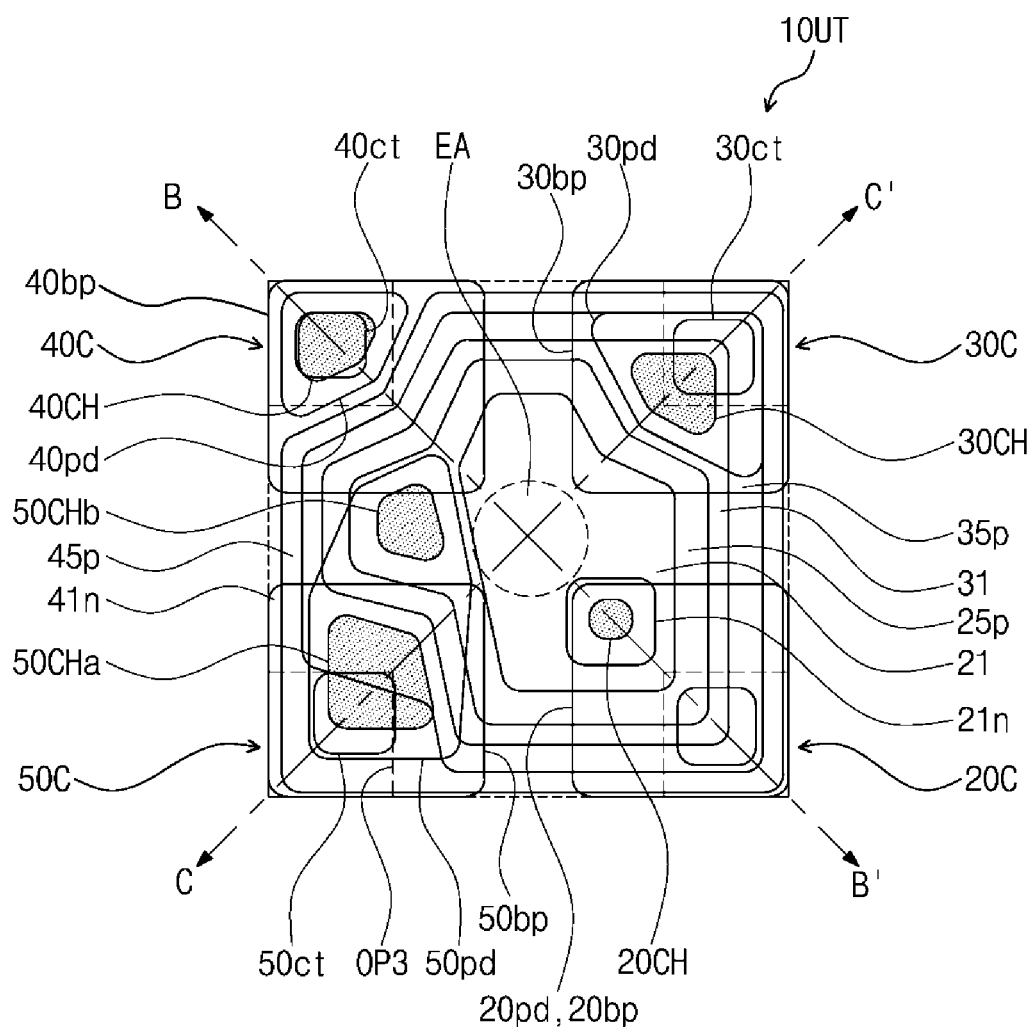
FIG. 11A is a plan view of a light emitting device of FIG. 10.
Figure 11B:
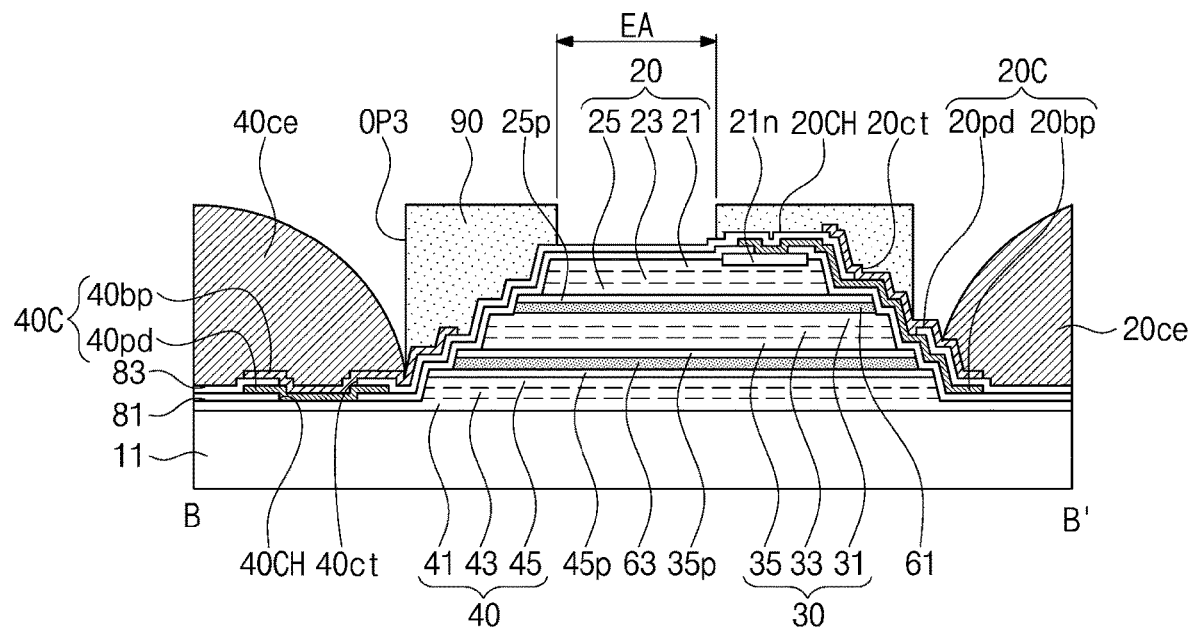
FIGS. 11B and 11C are cross-sectional views taken along lines B-B' and C-C' of FIG. 11A, respectively.
Figure 11C:
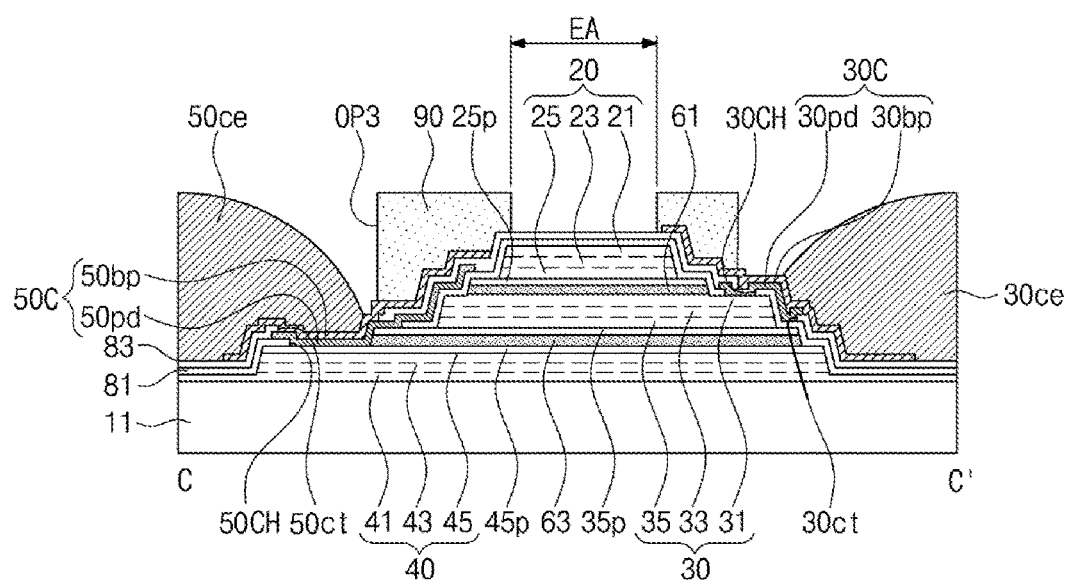

FIG. 10 is a cross-sectional view of a light emitting device package corresponding to the line A-A' of FIG. 8A according to another exemplary embodiment. FIG. 11A is a plan view of a light emitting device of FIG. 10, and FIGS. 11B and 11C are cross-sectional views respectively taken along lines B-B' and C-C' of FIG. 11A.

Referring to FIGS. 10 and 11A to 11C, portions of the bump electrodes may be disposed on the light emitting structure. For example, at least portions of the first, second, third, and fourth bump electrodes 20*bp*, 30*bp*, 40*bp*, and 50*bp* may be disposed on the third epitaxial stack 40.

In the illustrated exemplary embodiment, structures of the first, second, and third epitaxial stacks 20, 30, and 40, and the first, second, third, and fourth pads 20*pd*, 30*pd*, 40*pd*, and 50*pd* may be substantially the same as those described above, except the positions of the first, second, third, and fourth bump electrodes 20*bp*, 30*bp*, 40*bp*, and 50*bp*. In particular, referring back to FIGS. 8A to 9C, the first, second, third, and fourth bump electrodes 20*bp*, 30*bp*, 40*bp*, and 50*bp* extend outside the light emitting structure 10, and the portions of the first, second, third, and fourth bump electrodes 20*bp*, 30*bp*, 40*bp*, and 50*bp* are disposed on the substrate 11. However, according to the illustrated exemplary embodiment, each of the first, second, third, and fourth bump electrodes 20*bp*, 30*bp*, 40*bp*, and 50*bp* are disposed on the light emitting structures. In this case, the first, second, third, and fourth bump electrodes 20*bp*, 30*bp*, 40*bp*, and 50*bp* are disposed at positions higher than when the bump electrodes are disposed on the substrate 11.

According to an exemplary embodiment, the outer electrodes and the bump electrodes may have substantially the same height as each other to easily connect the outer electrodes to the bump electrodes using the connection electrodes. Accordingly, when the bump electrodes are disposed on one of the epitaxial stacks, rather than being disposed on the substrate 11, a depth of a first recess portion OP1 may be adjusted such that the plane on which the bump electrodes are disposed is substantially coplanar with the plane on which the outer electrodes are disposed. For example, a thickness H1 of the substrate 11 may be less than a depth H2 of the first recess portion Op1. In particular, the depth H2 of the first recess portion OP1 may be set to be greater than the thickness H1 of the substrate 11 in consideration of positions of the epitaxial stacks on which the bump electrodes are provided.

The light emitting device package having the above-mentioned structure may be manufactured by preparing a base substrate 91, on which outer electrodes are formed, and a light emitting device, placing the light emitting device on the base substrate 91, and electrically connecting the outer electrodes to the light emitting device, which will be described in more detail below.

FIGS. 12A, 13A, 14A, and 15A are plan views illustrating a method of manufacturing a light emitting device package according to an exemplary embodiment, and FIGS. 12B, 13B, 14B, and 15B to 15D are cross-sectional views corresponding to the plan views of FIGS. 12A, 13A, 14A, and 15A.

Figure 12A:
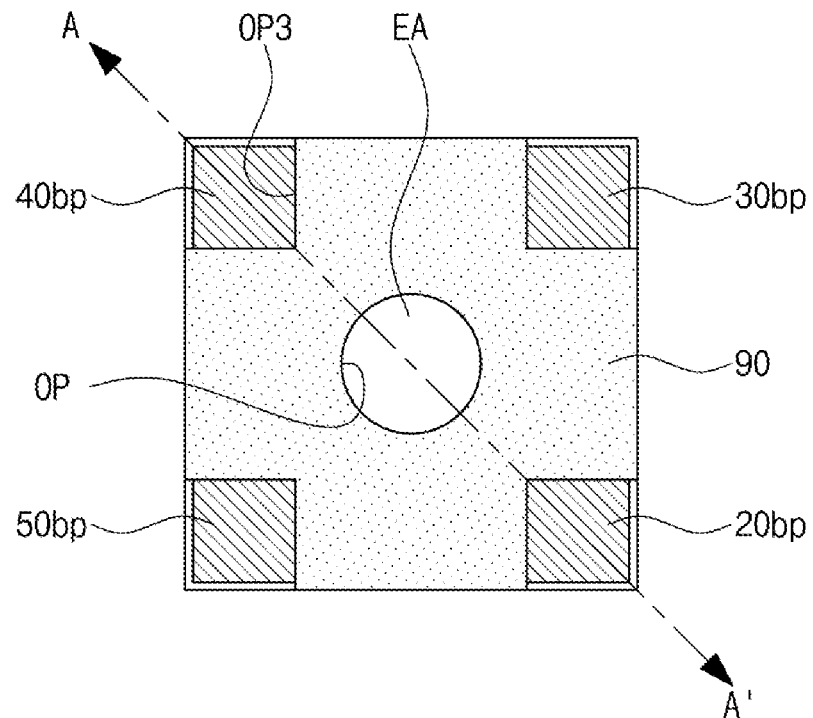
FIGS. 12A, 13A, 14A, and 15A are plan views illustrating a method of manufacturing a light emitting device package according to an exemplary embodiment.
Figure 12B:
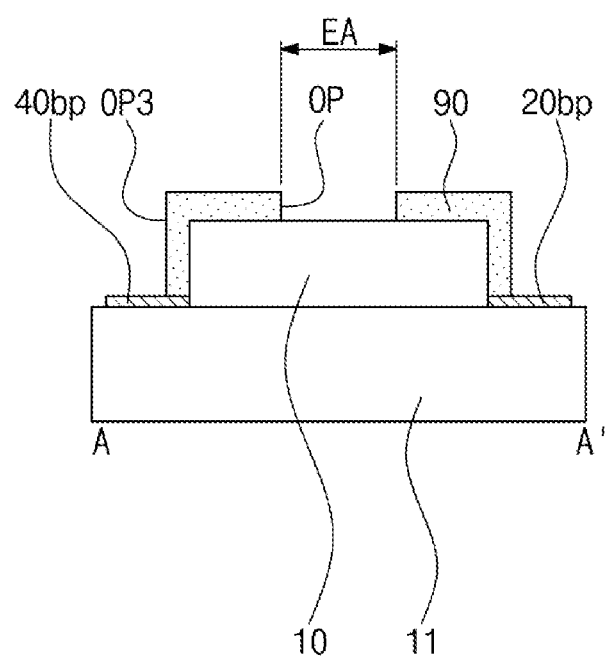
FIGS. 12B, 13B, 14B, and 15B, 15C, and 15D are cross-sectional views corresponding to the plan views of FIGS. 12A, 13A, 14A, and 15A.

Referring to FIGS. 12A and 12B, the light emitting device 10UT is prepared. The light emitting device 10UT may be manufactured by forming the light emitting structure 10 on the substrate 11. The light emitting structure 10 may be manufactured by sequentially forming the third epitaxial stack, the second epitaxial stack, and the first epitaxial stack on the substrate 11, sequentially patterning the first epitaxial stack, the second epitaxial stack, and the third epitaxial stack using a photolithography process, and forming the first to fourth pads and the first, second, third, and fourth bump electrodes 20*bp*, 30*bp*, 40*bp*, and 50*bp*.

The second insulating member 90 is formed on the light emitting structure 10, and the third recess portion OP3 and the opening OP are formed through the second insulating member 90 to expose the portions of the first, second, third, and fourth bump electrodes 20*bp*, 30*bp*, 40*bp*, and 50*bp*, and the light emission area EA.

Figure 13A:
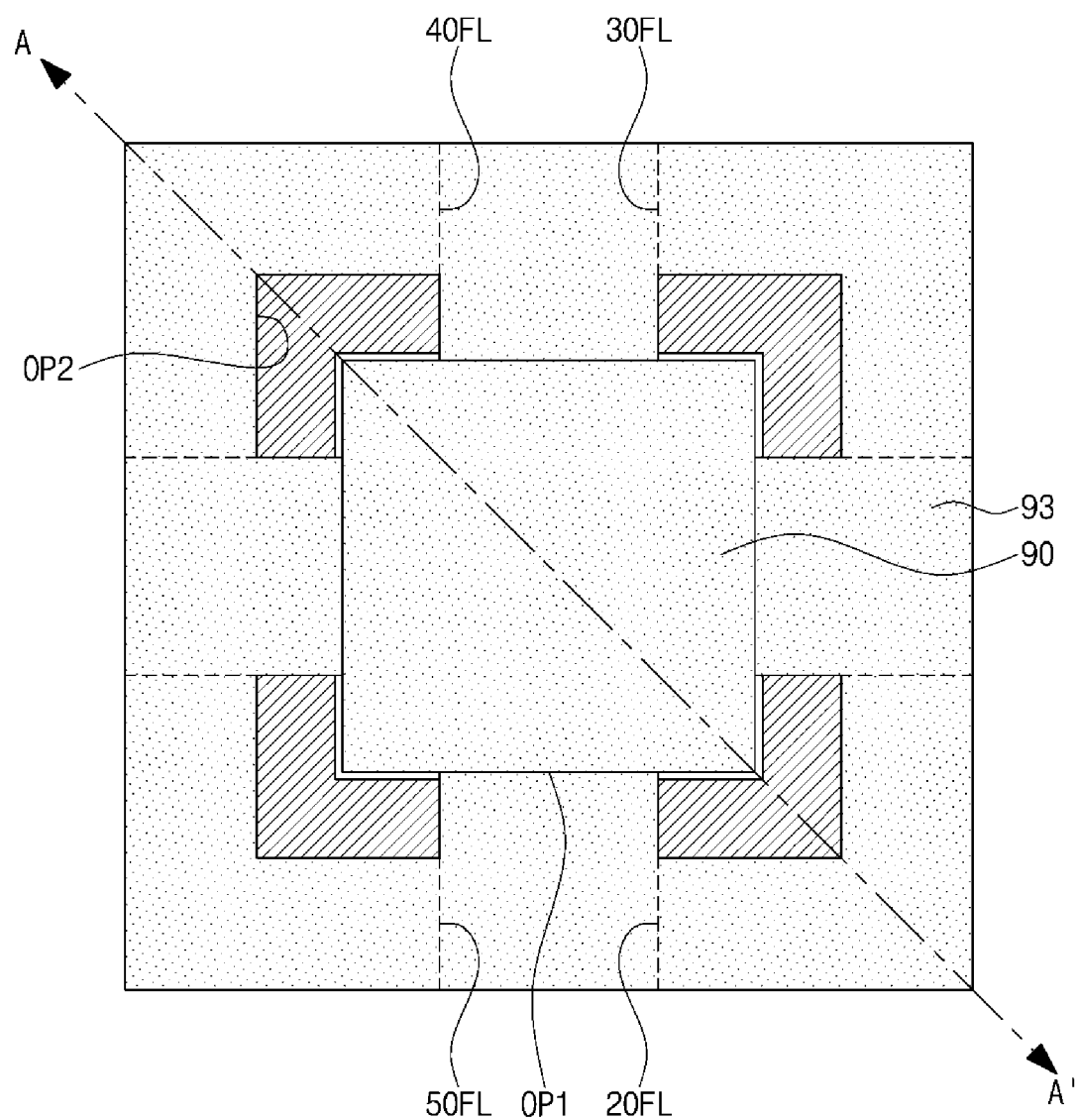
Figure 13B:
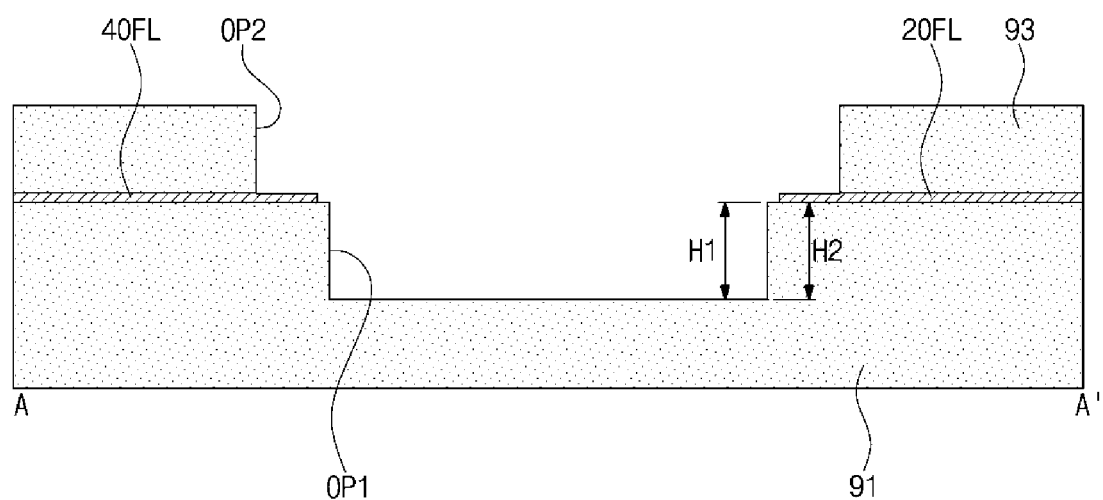

Referring to FIGS. 13A and 13B, the base substrate 91 is prepared separately from the light emitting device 10UT. The first, second, third, and fourth outer electrodes 20FL, 30FL, 40FL, and 50FL are formed on the base substrate 91, and the first insulating member 93 is formed on the first, second, third, and fourth outer electrodes 20FL, 30FL, 40FL, and 50FL.

The first recess portion OP1 having a predetermined depth is formed in the base substrate 91, and the second recess portions OP2 are formed through the first insulating member 93 to expose portions of the first, second, third, and fourth outer electrodes 20FL, 30FL, 30FL, and 50FL. The first recess portion OP1 is formed to have the size and the shape corresponding to the size and the shape of the light emitting device 10UT shown in FIGS. 12A and 12B.

Figure 14A:
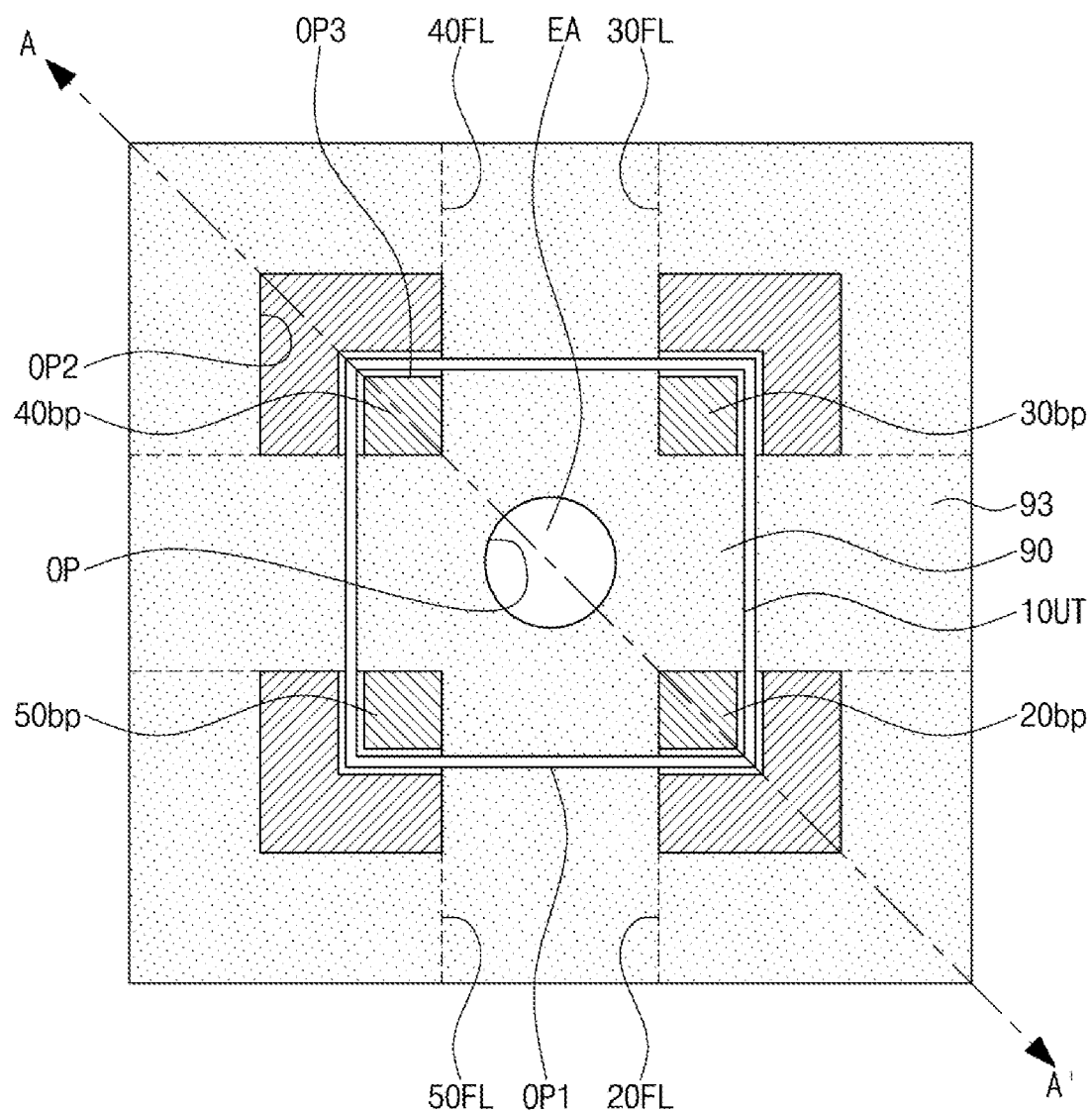
Figure 14B:
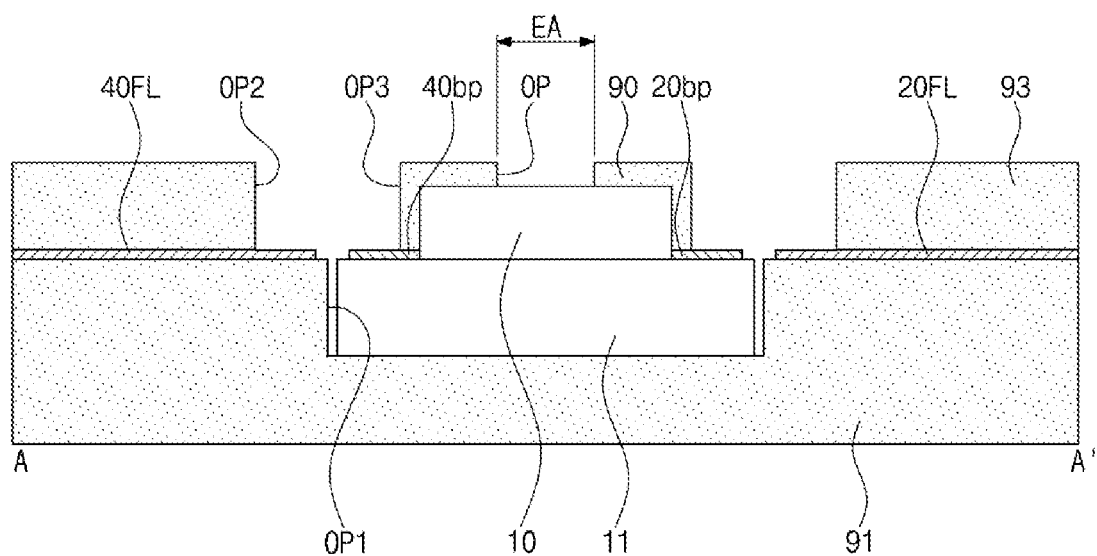

Referring to FIGS. 14A and 14B, the light emitting device 10UT of FIGS. 12A and 12B, for example, is placed in the first recess portion OP1 of the base substrate 91. An adhesive may be provided between the bottom surface of the first recess portion OP1 of the base substrate 91 and the light emitting device 10UT. The first recess portion OP1 may be formed to have a size substantially the same as or slightly greater than the size of the light emitting device 10UT, such that the light emitting device 10UT may be easily inserted into the first recess portion OP1.

As the light emitting device 10UT is placed on the base substrate 91, the upper surface of the first, second, third, and fourth bump electrodes 20*bp*, 30*bp*, 40*bp*, and 50*bp* exposed by the third recess portion OP3 of the light emitting device 10UT, and the upper surface of the first, second, third, and fourth outer electrodes 20FL, 30FL, 40FL, and 50FL exposed by the second recess portion OP2 of the base substrate 91 may be disposed on substantially the same plane. As used herein, when two elements are described as being disposed "on substantially the same plane" may refer that the two elements are disposed on the exact same plane or on planes that have minute differences in height. When the first, second, third, and fourth connection electrodes 20*ce*, 30*ce*, 40*ce*, and 50*ce* to be formed are formed using an uncured material, such as solder, the first, second, third, and fourth connection electrodes 20*ce*, 30*ce*, 40*ce*, and 50*ce* may be easily formed on the first, second, third, and fourth outer electrodes 20FL, 30FL, 40FL, and 50FL even though there is the minute difference in height.

In addition, among the first, second, third, and fourth bump electrodes 20*bp*, 30*bp*, 40*bp*, and 50*bp* disposed on the light emitting device 10UT and the first, second, third, and fourth outer electrodes 20FL, 30FL, 40FL, and 50FL disposed on the base substrate 91, a pair of the bump electrode and the outer electrode that correspond to each other may be disposed to be close to each other. In this case, the pair of the bump electrode and the outer electrode, which is exposed by the second and third recess portions OP2 and OP3, may be surrounded by the sidewalls of the second and third recess portions OP2 and OP3.

Figure 15A:
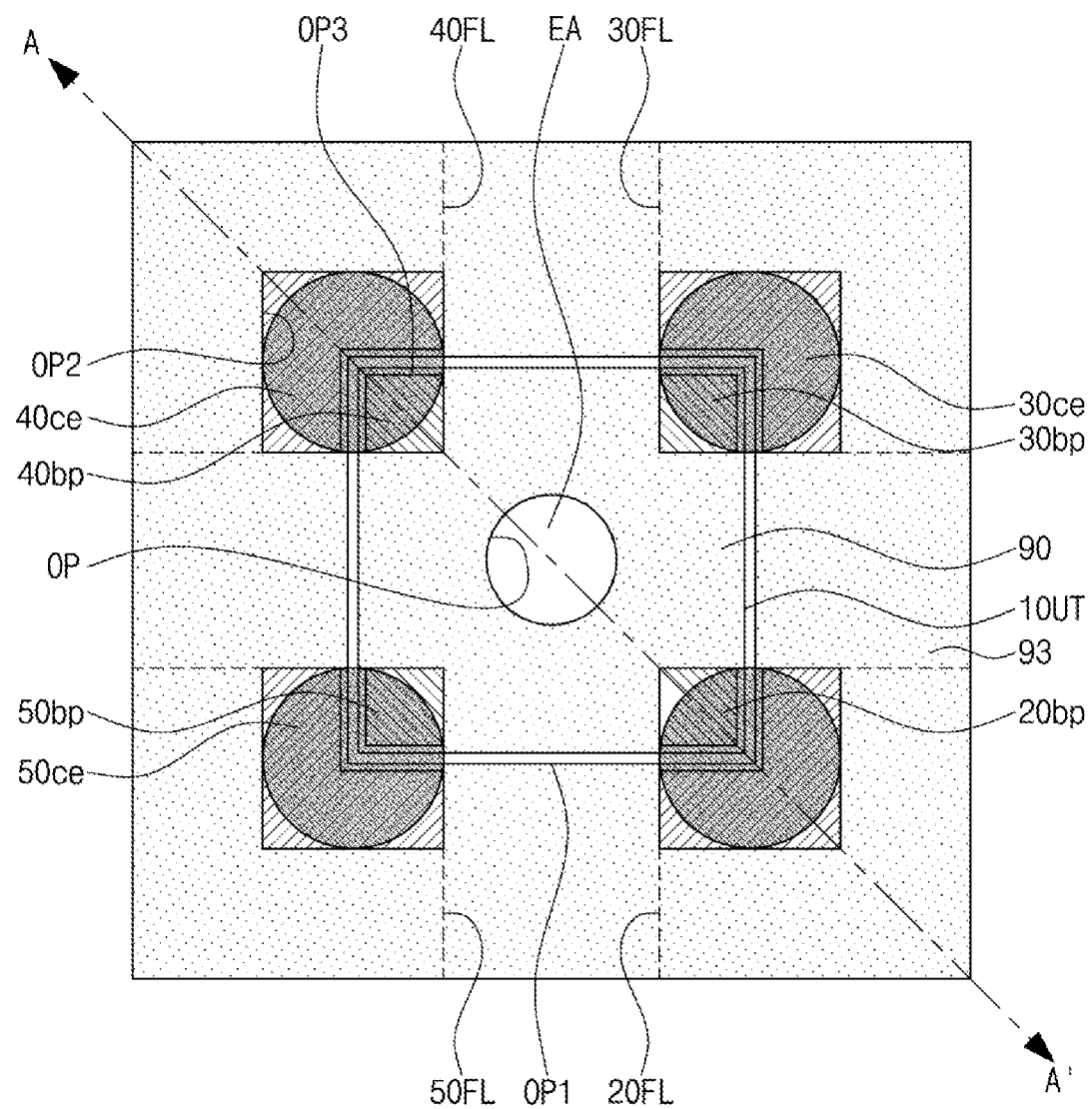
Figure 15B:
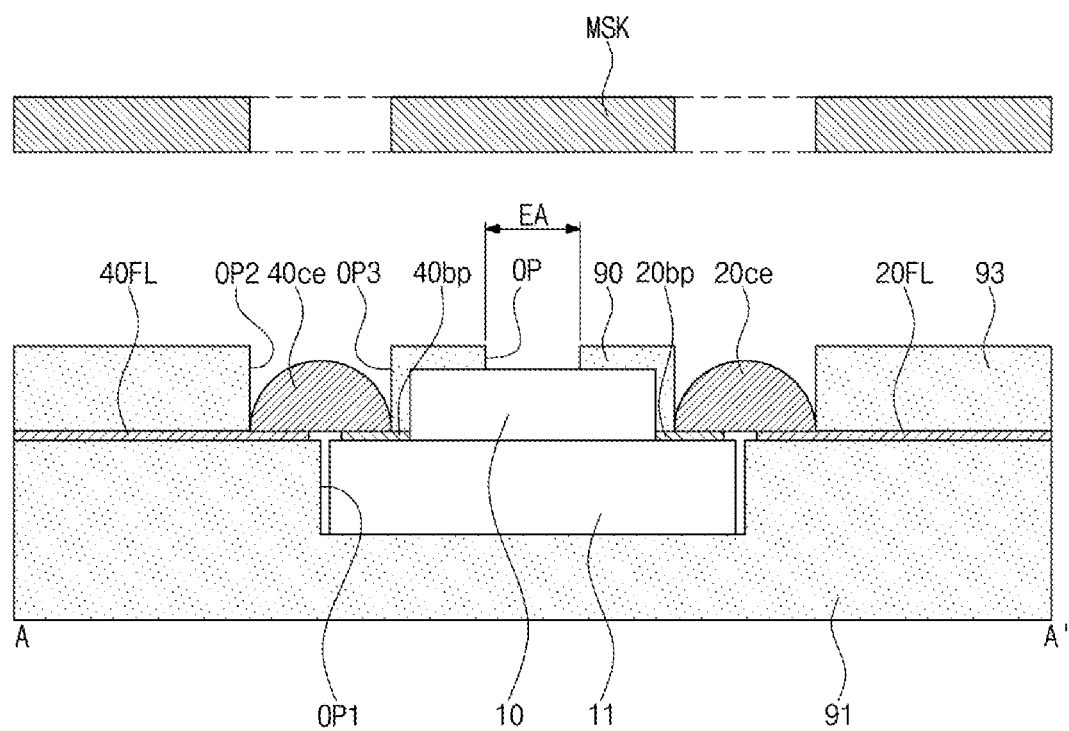

Referring to FIGS. 15A and 15B, the first, second, third, and fourth connection electrodes 20*ce*, 30*ce*, 40*ce*, and 50*ce* are formed on the bump electrode and the outer electrode, which are exposed by the second and third recess portions OP2 and OP3, using a printing method, such as the silkscreen. When the silkscreen printing method is used, a mask MSK having vertically penetrating portions and non-penetrating portions is prepared, and a material used to form the first, second, third, and fourth connection electrodes 20*ce*, 30*ce*, 40*ce*, and 50*ce* may be printed on the exposed bump electrode and the exposed outer electrode through the vertically penetrating portions. The first, second, third, and fourth connection electrodes 20*ce*, 30*ce*, 40*ce*, and 50*ce* may be formed of the uncured conductive material, and then stably formed in the area defined by the second and third openings OP2 and OP3 through reflowing and curing processes. The first, second, third, and fourth connection electrodes 20*ce*, 30*ce*, 40*ce*, and 50*ce* are illustrated as having a hemispherical shape, however, the inventive concepts are not limited to a particular shape of the first, second, third, and fourth connection electrodes 20*ce*, 30*ce*, 40*ce*, and 50*ce*. The shape of the first, second, third, and fourth connection electrodes 20*ce*, 30*ce*, 40*ce*, and 50*ce* may be partially changed during reflowing and curing processes to fill the second and third openings OP2 and OP3.

Figure 15C:
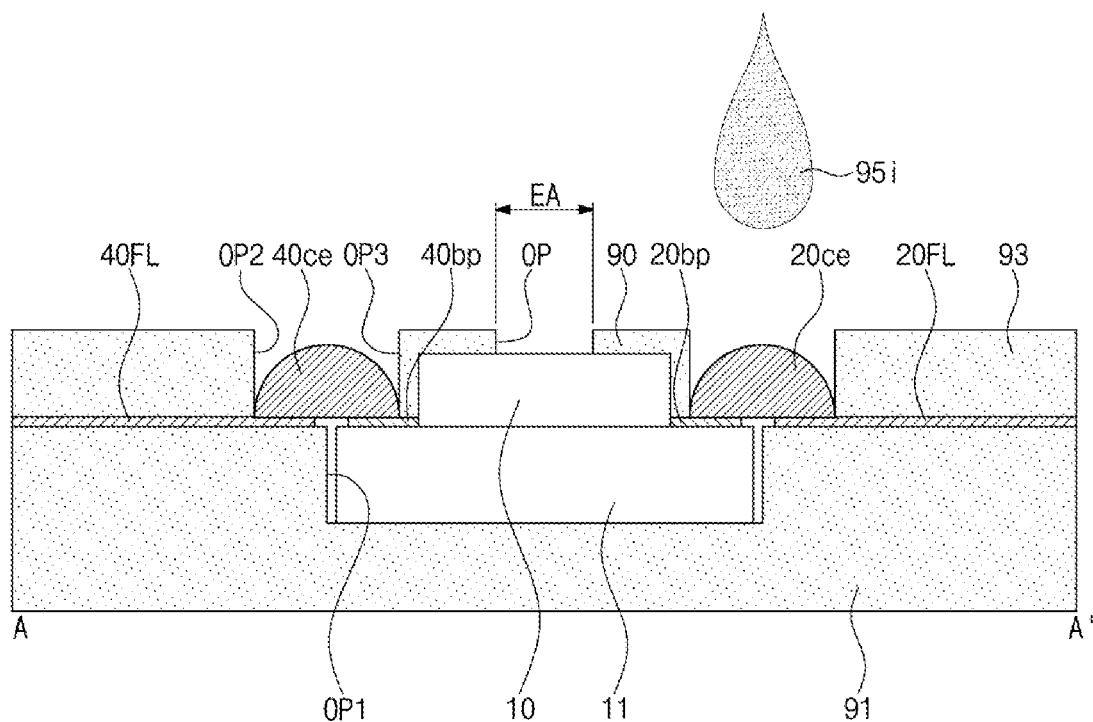

Referring to FIGS. 15A and 15C, a cover member 95 is formed on the base substrate 91 and the light emitting device 10UT, on which the connection electrodes are formed. The cover member 95 may be formed of an uncured organic material 95*i*, and may be dropped in the space defined by the second and third recess portions OP2 and OP3, for example. The uncured organic material 95*i* may be disposed in the space defined by the second and third recess portions OP2 and OP3, and a gap between the first recess portion OP1 and the light emitting device 10UT.

Figure 15D:
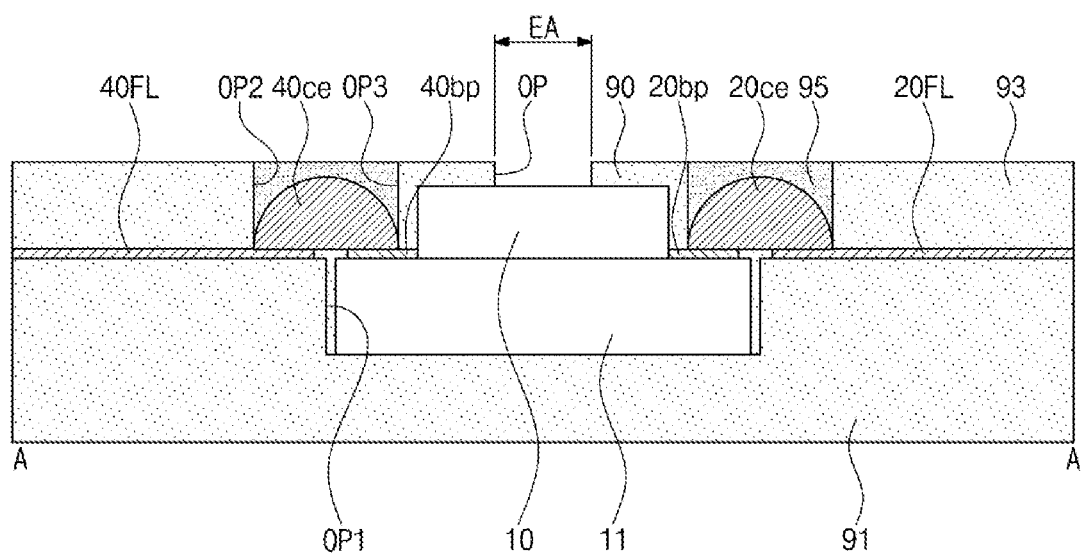

In this manner, the light emitting device package shown in FIG. 15D may be provided.

According to the illustrated exemplary embodiment, the base substrate 91 is described as having one first recess portion OP1 that corresponds to one light emitting device 10UT. However, the inventive concepts are not limited thereto. For example, in some exemplary embodiments, the base substrate 91 may include multiple first recess portions OP1, in which the multiple light emitting devices 10UT are disposed. In this case, the plural light emitting devices 10UT may be substantially simultaneously disposed on the base substrate 91, and then a light emitting device package having a single light emitting device a plurality of light emitting devices may be manufactured through a cutting process. In addition, the outer electrodes on the base substrate 91 may be arranged in various forms.

More particularly, when the base substrate 91 includes the multiple plural first recess portions OP1 to allow the plural light emitting devices 10UT to be disposed, the light emitting devices 10UT may be respectively mounted on the first recess portions OP1, and each light emitting device 10UT may function as one pixel. In this case, the pixels may be arranged in a matrix form, and the pixels may be connected to the scan driver or the data driver via the first to fourth bump electrodes, the first to fourth connection electrodes, and the first to fourth outer electrodes.

The light emitting device package having the plural light emitting devices on one base substrate may be used as a single display device, but the light emitting device packages each including a plurality of base substrates may be used as one display device after being connected to each other. When the plural light emitting device packages form one display device, increase in size of the display device may be easily achieved.

In addition, in the light emitting device package according to an exemplary embodiment, the connection electrodes may be easily formed through a printing method, such as the silkscreen, since the portion of the light emitting device and the portion of the first to fourth outer electrodes are disposed on substantially the same plane. As such, the manufacturing method of the light emitting device package may be simplified, and the manufacturing cost may be reduced. In a conventional light emitting device, since electrodes to be connected to each other are disposed on different planes from each other, the time and costs for connecting the two electrodes by wires may be high.

Figure 16A:
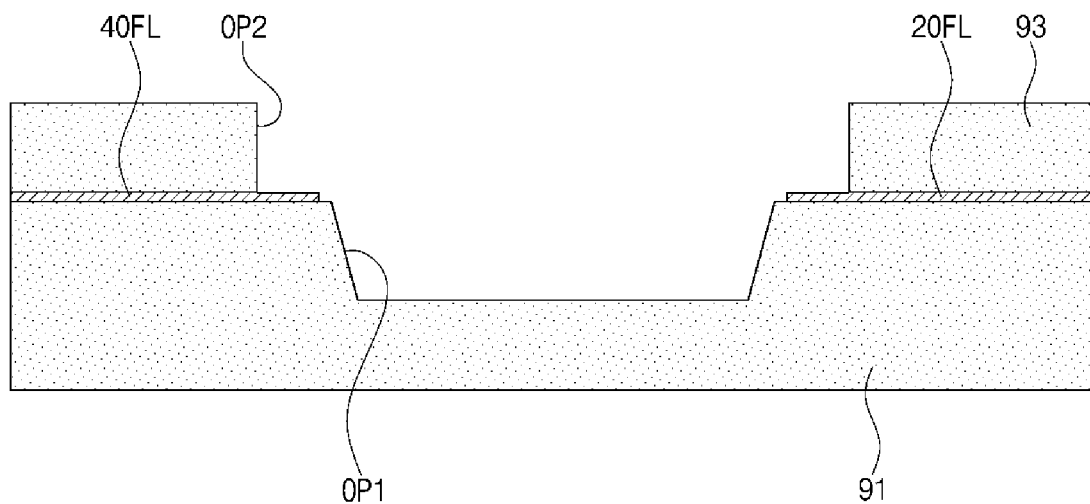
FIGS. 16A, 16B, and 16C are cross-sectional views corresponding to FIG. 13B according to exemplary embodiments.
Figure 16B:
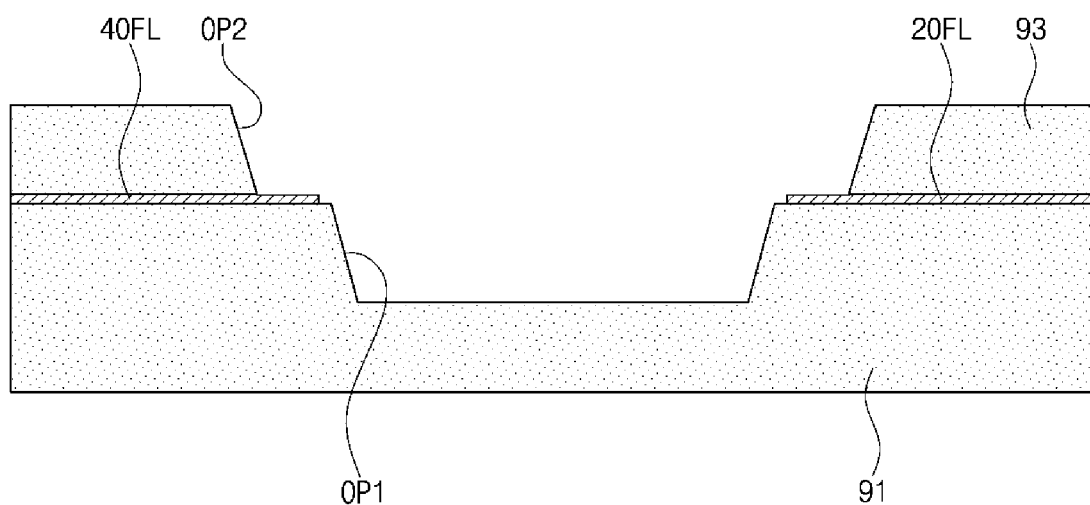
Figure 16C:
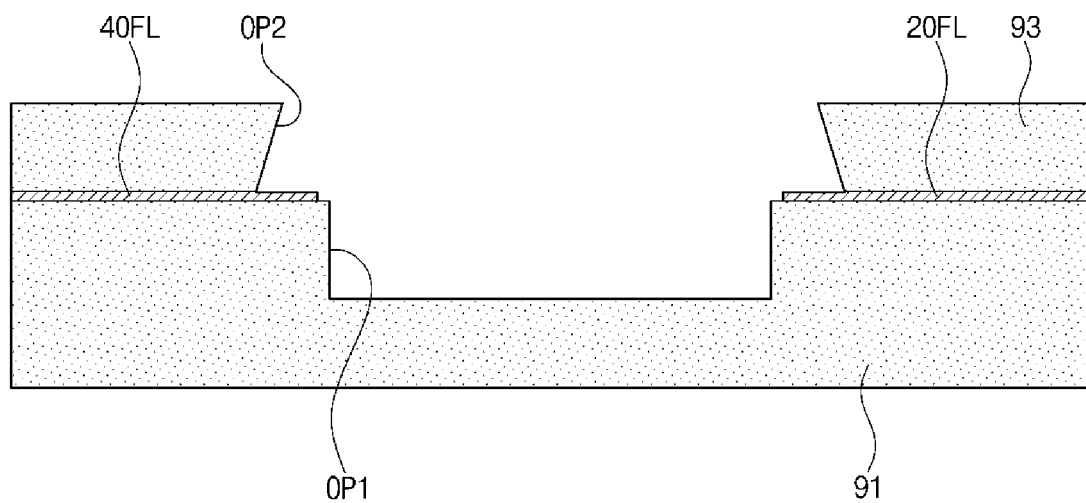

According to an exemplary embodiment, the base substrate and the first insulating member may have various shapes, and the first and second recess portions may have various shapes. FIGS. 16A to 16C are cross-sectional views corresponding to FIG. 13B illustrating a base substrate and a first insulating member according to exemplary embodiments.

Referring to FIGS. 16A to 16C, in a first recess portion OP1 and a second recess portion OP2, at least one sidewall of sidewalls of the first recess portion OP1 and the second recess portion OP2 may be formed to be substantially perpendicular to a bottom surface or inclined with respect to the bottom surface. When the at least one sidewall of the sidewalls of the first recess portion OP1 and the second recess portion OP2 is formed inclined with respect to the bottom surface, the at least one sidewall may be tapered or may be reversely tapered. In some exemplary embodiments, a third recess portion OP3 on a second insulating member 90 may be inclined with respect to a bottom surface thereof.

The inclination of the sidewalls may be appropriately controlled in consideration of the manufacturing process or the subsequent processes, for example, ease of placing the light emitting device, spreadability of an ink during the silkscreen process, and the like.

The light emitting device package according to the exemplary embodiments emits light in a direction away from the base substrate, and may not emit light towards the base substrate. In addition, the substrate is disposed between the light emitting device and the base substrate. Accordingly, the damage to a chip during pick and place processes may be significantly reduced. As used herein, a direction away from the base substrate and a direction towards the base substrate may be referred to as the upward direction and the downward direction, respectively. When a conventional light emitting device package is transferred to and placed on another apparatus, individual chips are separated by the light emitting device package being gripped at an upper side by a vacuum collet, and the light emitting device package is pressed upward by using an eject pin at a lower side. In this case, the light emitting structure may be damaged when the light emitting device package is pressed upward by using the eject pin at the lower side. However, according to the exemplary embodiments, since the substrate is disposed at the lower side and the light emitting structure is disposed on the substrate, the damage to the light emitting structure may be prevented or at least be suppressed even though a pressure is applied to the light emitting device package from the lower side by using the eject pin.

According to the exemplary embodiments, the light emitting device package and the display device employing the same may have a simple structure and may be simply manufactured.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a base including a front side including a recess and a rear side;
outer electrodes covered by the base;
a light source disposed on the recess and configured to emit light in a direction away from the base, the light source comprising a substrate and a light emitter electrically connected to the outer electrodes,
connection electrodes electrically connecting the light source to the outer electrodes, wherein the connection electrodes are extended from the light emitter to laterally outward of the light emitter with respect to the front side of the base; and
a first insulator disposed lower than the light emitter,
wherein the connection electrodes include curved regions when viewed in a cross section,
wherein a thickness of each of the connection electrodes is greater than a thickness of the light emitter,
wherein the base has substantially a rectangular shape when viewed from above,
wherein the curved regions of the connection electrodes are covered by a cover layer.

2. The display device of claim 1, wherein the light source further comprises a plurality of bump electrodes electrically connected to the light emitter, and
wherein the outer electrodes are electrically connected to the light emitting structure through the bump electrodes.

3. The display device of claim 2, wherein the connection electrodes connect the outer electrodes to the bump electrodes.

4. The display device of claim 1,
wherein the cover layer fills a space between a side surface of the recess and the light source.

5. The display device of claim 4, a width of an upper region of the recess is greater than a width of the lower region of the recess.

6. The display device of claim 1,
wherein the outer electrodes are exposed at side surfaces of the base.

7. The display device of claim 1, wherein a distance between the base and a farthest point of each of the curved regions from the base is farther than a distance of between the base and a farthest surface of the light source from the base.

8. A display device comprising:
a base including a front side including a recess and a rear side;
outer electrodes covered by the base;
a light source disposed on the recess and configured to emit light in a direction away from the base, the light source comprising a substrate and a light emitter electrically connected to the outer electrodes;
connection electrodes electrically connecting the light source to the outer electrodes, wherein the connection electrodes are extended from the light emitter to laterally outward of the light emitter with respect to the front side of the base; and
a first insulator disposed lower than the light emitter,
wherein connection electrodes include rounded regions when viewed in a cross section,
wherein a thickness of each of the connection electrodes is greater than a thickness of the light emitter,
wherein the base includes at least four corners when viewed from above, wherein the rounded regions of the connection electrodes are covered by a cover layer.

9. The display device of claim 8, wherein the light source further comprises a plurality of bump electrodes electrically connected to the light emitter, and
wherein the outer electrodes are electrically connected to the light emitter through the bump electrodes.

10. The display device of claim 9, wherein the connection electrodes connect the outer electrodes to the bump electrodes.

11. The display device of claim 8, wherein the cover layer fills a space between a side surface of the recess and the light source.

12. The display device of claim 11, wherein a width of an upper region of the recess is greater than a width of a lower region of the recess.

13. The display device of claim 8, wherein a portion of the outer electrodes is exposed at side surfaces of the base.

14. The display device of claim 8, wherein a distance of between the base and a farthest of the light source is less than a distance between the base and a farthest point of each of the curved regions from the base.

15. A light emitting apparatus comprising:
a base including a front side including a recess and a rear side;
outer electrodes covered by the base;
a light source disposed on the recess and configured to emit light in a direction away from the base, the light source comprising a substrate and a light emitter electrically connected to the outer electrodes;
connection electrodes electrically connecting the light source to the outer electrodes, wherein the connection electrodes are extended from the light emitter to laterally outward of the light emitter with respect to the front side of the base; and
a first insulator disposed under the light emitter,
wherein connection electrodes include curved regions when viewed in a cross section,
wherein a thickness of each of the connection electrodes is greater than a thickness of the light emitter,
wherein the light source has substantially a rectangular shape when viewed from above,
wherein the curved regions of the connection electrodes are covered by a cover layer.

16. The light emitting apparatus of claim 15, wherein the light source further comprises a plurality of bump electrodes electrically connected to the light emitter,
wherein the outer electrodes are electrically connected to the light emitter through the bump electrodes, and
wherein the connection electrodes connect the outer electrodes to the bump electrodes.

17. The display device of claim 15, wherein the cover layer fills a space between a side surface of the recess and the light source.

18. The display device of claim 17, wherein a side surface of the recess is inclined with respect to a bottom surface of the recess.

19. The display device of claim 15, wherein the outer electrodes are exposed at side surfaces of the base.

20. The display device of claim 15, wherein a distance between the base and a farthest point of each of the curved regions from the base is farther than a distance of between the base and a farthest surface of the light source from the base.

* * * * *